(12) United States Patent
Huh et al.

(10) Patent No.: US 11,462,623 B2
(45) Date of Patent: Oct. 4, 2022

(54) SEMICONDUCTOR DEVICE AND METHOD OF FORMING THE SAME

(71) Applicant: SAMSUNG ELECTRONICS CO., LTD., Suwon-si (KR)

(72) Inventors: Junghwan Huh, Suwon-si (KR); Dongchan Kim, Suwon-si (KR); Dae Hyun Kim, Suwon-si (KR); Euiju Kim, Suwon-si (KR); Jisoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 17/222,474

(22) Filed: Apr. 5, 2021

(65) Prior Publication Data

US 2021/0242320 A1 Aug. 5, 2021

Related U.S. Application Data

(63) Continuation of application No. 16/523,529, filed on Jul. 26, 2019, now Pat. No. 10,985,255.

(30) Foreign Application Priority Data

Nov. 9, 2018 (KR) .................. 10-2018-0137205

(51) Int. Cl.
*H01L 29/423* (2006.01)
*H01L 29/78* (2006.01)
(Continued)

(52) U.S. Cl.
CPC .... *H01L 29/4236* (2013.01); *H01L 29/42364* (2013.01); *H01L 29/4916* (2013.01); *H01L 29/518* (2013.01); *H01L 29/7827* (2013.01)

(58) Field of Classification Search
CPC ....... H01L 21/76877; H01L 21/823412; H01L 21/823437; H01L 21/82345;
(Continued)

(56) References Cited

U.S. PATENT DOCUMENTS 9,972,525 B2 5/2018 Song et al.
2001/0001729 A1 5/2001 Leverd et al.
(Continued)

FOREIGN PATENT DOCUMENTS

KR 10-1999-0060829 A 7/1999
KR 10-2003-0053551 A 7/2003
(Continued)

*Primary Examiner* — Cheung Lee
(74) *Attorney, Agent, or Firm* — Sughrue Mion, PLLC

(57) ABSTRACT

A semiconductor device includes a substrate including an active region, a gate trench disposed in the substrate and crossing the active region; a gate dielectric layer disposed in the gate trench; a first gate electrode disposed on the gate dielectric layer and including center and edge portions; a second gate electrode disposed on the first gate electrode; a gate capping insulating layer disposed on the second gate electrode and filling the gate trench; and first and second impurity regions disposed in the substrate opposite to each other with respect to the gate trench. A top surface of each of the center and edge portions contacts a bottom surface of the second gate electrode. The top surface of the second gate electrode is concave. The bottom surface of the gate capping insulating layer is convex, and a side surface of the gate capping insulating layer contacts the gate dielectric layer.

20 Claims, 21 Drawing Sheets

(51) Int. Cl.
*H01L 29/51* (2006.01)
*H01L 29/49* (2006.01)

(58) Field of Classification Search
CPC ....... H01L 21/823828; H01L 21/82385; H01L 27/105; H01L 27/11517; H01L 27/11582; H01L 29/1025; H01L 29/1029; H01L 29/1033; H01L 29/42312; H01L 29/4232; H01L 29/42356; H01L 29/4236; H01L 29/42364; H01L 29/4916; H01L 29/518; H01L 29/7827
See application file for complete search history.

(56) References Cited

U.S. PATENT DOCUMENTS

| | | |
|---|---|---|
| 2013/0341710 A1 | 12/2013 | Choi et al. |
| 2014/0077294 A1 | 3/2014 | Hwang et al. |
| 2017/0125422 A1 | 5/2017 | Kang |
| 2018/0005835 A1 | 1/2018 | Yu et al. |

FOREIGN PATENT DOCUMENTS

| | | |
|---|---|---|
| KR | 10-2007-0054932 A | 5/2007 |
| KR | 10-2013-0142738 A | 12/2013 |

SEMICONDUCTOR DEVICE AND METHOD OF FORMING THE SAME

CROSS-REFERENCE TO RELATED APPLICATION(S)

This application is a continuation application of U.S. application Ser. No. 16/523,529, filed Jul. 26, 2019, which claims priority from Korean Patent Application No. 10-2018-0137205 filed on Nov. 9, 2018 in the Korean Intellectual Property Office, the disclosure of which is incorporated by reference herein in its entirety.

BACKGROUND

1. Field

The present disclosure relates to a semiconductor device, and more particularly, to a semiconductor device and a method of forming the same.

2. Description of Related Art

As semiconductor devices have become more highly integrated, the patterns forming a semiconductor device are becoming increasingly finer. Semiconductor devices that are shipped as identical products are required to include identical patterns that are identical in size in order for the semiconductor devices to provide identical levels of performance and/or to have identical characteristics. However, since the patterns forming the semiconductor device are becoming increasingly finer, variations in size among these patterns is becoming even greater.

SUMMARY

It is an aspect to provide a semiconductor device having improved thickness characteristics.

It is another aspect to provide a method of forming a semiconductor device, which can form patterns having uniform thicknesses.

According to an aspect of an example embodiment, there is provided a semiconductor device comprising a gate trench crossing an active region, and a gate structure in the gate trench. The gate structure includes a gate dielectric layer disposed on an inner wall of the gate trench, a gate electrode disposed on the gate dielectric layer and partially filling the gate trench, a gate capping insulating layer disposed on the gate electrode, and a gap-fill insulating layer disposed in the gate trench and disposed on the gate capping insulating layer. The gate capping insulating layer includes a material formed by oxidizing a portion of the gate electrode, nitriding the portion of the gate electrode, or oxidizing and nitriding the portion of the gate electrode.

According to another aspect of an example embodiment, there is provided a semiconductor device comprising a gate trench crossing an active region; a gate structure in the gate trench, wherein the gate structure includes a gate electrode; a gap-fill insulating layer on the gate electrode; a gate capping insulating layer between the gate electrode and the gap-fill insulating layer; and a gate dielectric layer interposed between the gate electrode and an inner wall of the gate trench, between a side surface of the gate capping insulating layer and a side wall of the gate trench, and between a side surface of the gap-fill insulating layer and a side wall of the gate trench, and wherein a first thickness of the gate capping insulating layer is less than a second thickness of the gap-fill insulating layer, and the gate capping insulating layer and the gate electrode include a common element.

According to another aspect of an example embodiment, there is provided a semiconductor device comprising wiring structures; a contact hole disposed between the wiring structures; a lower contact pattern disposed in the contact hole; an upper contact pattern disposed on the lower contact pattern; insulating spacers disposed between the lower contact pattern and the wiring structures, and between the upper contact pattern and the wiring structures; and an insulating layer disposed between the upper contact pattern and the insulating spacers, wherein the lower contact pattern includes a portion of the lower contact pattern in direct contact with the insulating spacers.

According to yet another aspect of an example embodiment, there is provided a method of forming a semiconductor device comprising forming a structure having an opening; forming a conductive layer covering the structure; etching the conductive layer to form a preliminary conductive pattern remaining within the opening; measuring an etching depth of the preliminary conductive pattern within the opening; and performing, based on the etching depth, a thickness control process to thin the preliminary conductive pattern to form a conductive pattern.

BRIEF DESCRIPTION OF DRAWINGS

The above and other aspects will be more clearly understood from the following detailed description, taken in conjunction with the accompanying drawings, in which.

DETAILED DESCRIPTION

Hereinbelow, example embodiments will be described with reference to the accompanying drawings.

Figure 1:
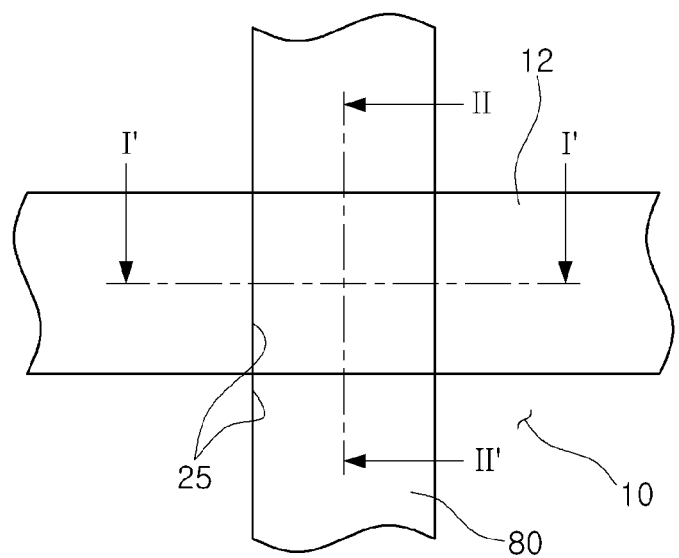
FIG. 1 is a plan view of a semiconductor device according to an example embodiment.
Figure 2:
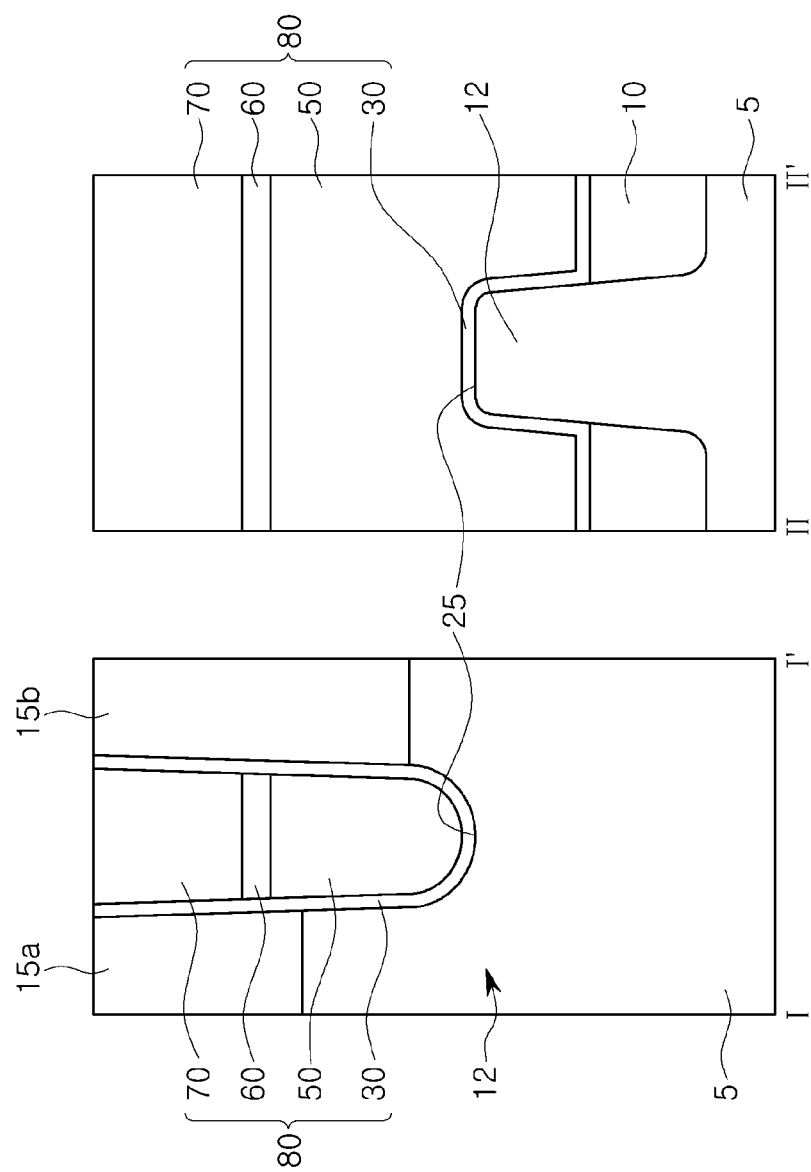
FIG. 2 is a cross-sectional view illustrating an example of a semiconductor device according to an example embodiment.

Referring to FIG. 1 and FIG. 2, an example of a semiconductor device according to an example embodiment will be described. FIG. 1 is a plan view of a semiconductor device according to the example embodiment, and FIG. 2 is a cross-sectional view illustrating regions taken along lines I-I' and II-II' of FIG. 1 to illustrate examples of a semiconductor device according to the example embodiment.

Referring to FIG. 1 and FIG. 2, a semiconductor substrate 5 may be provided. For example, the semiconductor substrate 5 may be a silicon substrate.

A field region 10 may be disposed in the semiconductor substrate 5 to define an active region 12. The field region 10 may be a shallow trench isolation (STI). For example, the field region 10 may include a field trench formed in the semiconductor substrate 5, and an insulating material filling the field trench, for example, a silicon oxide. The field region 10 may be referred to as 'isolation region'. The active region 12 may be a first conductivity-type region. The first conductivity-type may be P-type conductivity or N-type conductivity.

A gate trench 25 may cross the active region 12 and extend into the field region 10. A bottom surface of a portion of the gate trench 25 located in the active region 12 may be disposed at a level higher than a bottom surface of a portion of the gate trench 25 located in the field region 10. For example, a difference in heights between a top surface of the active region 12 and the bottom surface of the gate trench 25 located in the field region 10 may be greater than a difference in heights between the top surface of the active region 12 and the bottom surface of the gate trench 25 located in the active region 12.

A first impurity region 15a and a second impurity region 15b may be disposed in the active region 12. The first and second impurity regions 15a and 15b may be source/drain regions. Accordingly, the first impurity region 15a may be referred to as 'first source/drain region', and the second impurity region 15b may be referred to as 'second source/drain region'. The first impurity region 15a and the second impurity region 15b may be separated and spaced apart from each other by the gate trench 25.

In an example, the first and second impurity regions 15a and 15b may have an asymmetric source/drain structure. For example, the first impurity region 15a may have a junction depth shallower than a junction depth of the second impurity region 15b. For example, the depth from the top surface of the active region 12 to the bottom of the first impurity region 15a may be less than the depth from the top surface of the active region 12 to the bottom of the second impurity region 15b.

A gate structure 80 may be disposed in the gate trench 25.

The gate structure 80 may include a gate dielectric layer 30, a gate electrode 50, a gate capping insulating layer 60, and a gap-fill insulating layer 70.

The gate dielectric layer 30 may cover an inner wall of the gate trench 25. The gate electrode 50 may be disposed on the gate dielectric layer 30 and partially fill the gate trench 25. The gate capping insulating layer 60 may be disposed on the gate electrode 50. The gap-fill insulating layer 70 may be disposed in the gate trench 25, and may be disposed on the gate capping insulating layer 60.

The gate dielectric layer 30 may be interposed between an inner wall of the gate trench 25 and the gate electrode 50, and may be interposed between a side wall of the gate trench 25 and the gate capping insulating layer 60, and between a side wall of the gate trench 25 and the gap-fill insulating layer 70.

The gate dielectric layer 30 may include a silicon oxide. In another example, the gate dielectric layer 30 may include a silicon oxide and a high-k dielectric material with a higher dielectric constant than a dielectric constant of the silicon oxide.

In example embodiments, the gate dielectric layer 30, the gate electrode 50, and the first and second impurity regions 15a and 15b may form a transistor.

At least a portion of the gate electrode 50 may be formed of a silicon material. For example, in some example embodiments, the entire gate electrode 50 may be formed of a silicon material. In other example embodiments, a portion of the gate electrode 50 adjacent to the gate capping insulating layer 60 may be formed of a silicon material.

The gate capping insulating layer 60 may include a material formed by oxidizing and/or nitriding a portion of the gate electrode 50. For example, the gate capping insulating layer 60 may include a silicon oxide formed by oxidizing the silicon material of the gate electrode 50, a silicon nitride formed by nitriding the silicon material of the gate electrode 50, or a silicon oxynitride (SiON) formed by oxidizing and nitriding the silicon material of the gate electrode 50. The gate capping insulating layer 60 and the gate electrode 50 may include a common element. The common element may be silicon (Si).

Next, various modified examples of a semiconductor device according to an example embodiment will be described with reference to FIG. 3A, FIG. 3B, FIG. 4, FIG. 5, and FIG. 6. In detail, FIG. 3A, FIG. 3B, FIG. 4, FIG. 5, and FIG. 6 are cross-sectional views illustrating portions taken along lines I-I' and II-II' of FIG. 1 to illustrate various modified examples of a semiconductor device according to various example embodiments. In the description that follows, the same reference designators are used for the same elements, and repeated descriptions of the features from FIGS. 1 and 2 will be omitted for conciseness.

Figure 3A:
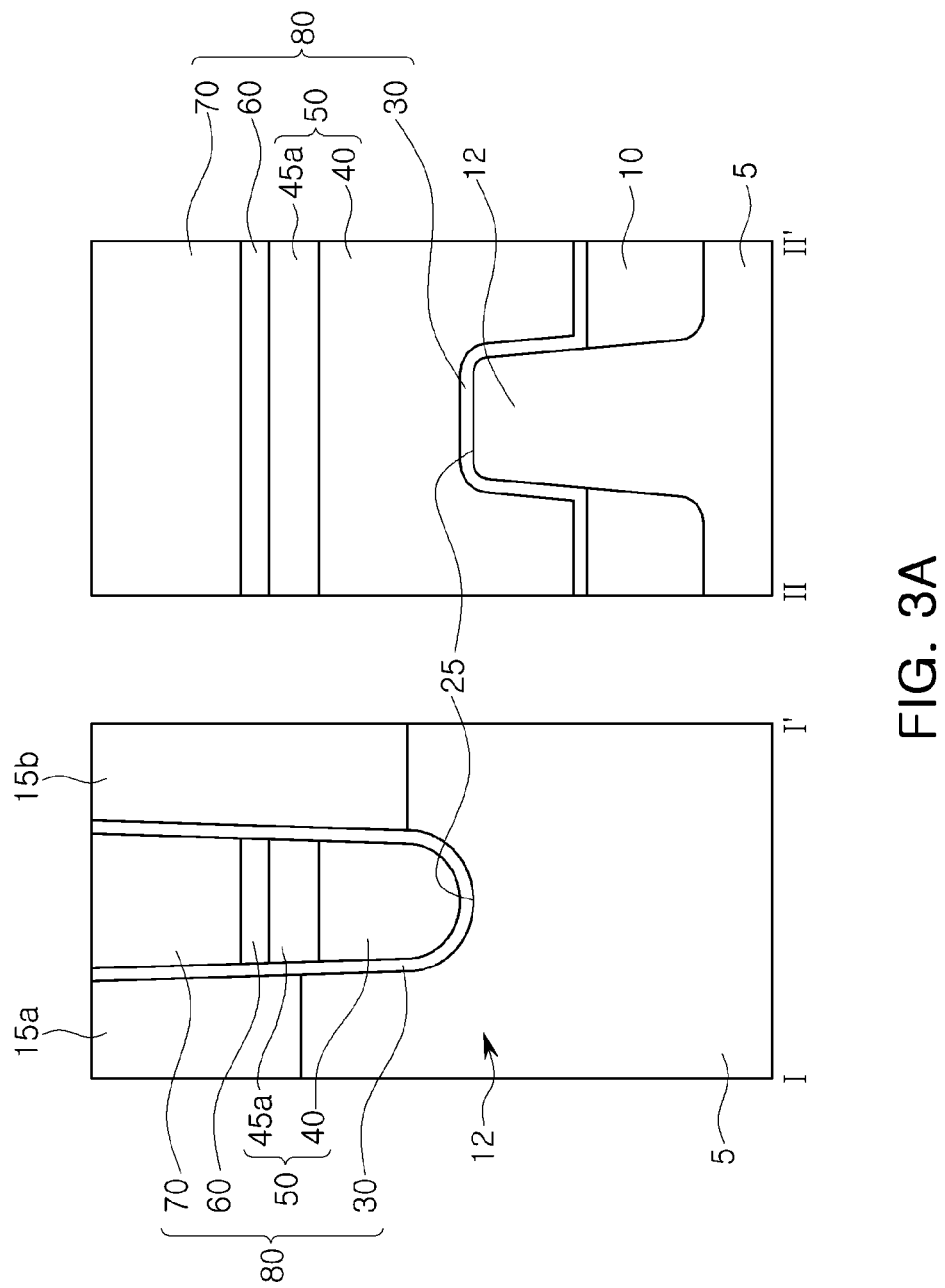
FIG. 3A is a cross-sectional view illustrating a modified example of a semiconductor device according to an example embodiment.

In a modified example, referring to FIG. 3A, the gate electrode 50 may include a lower gate electrode 40 and an upper gate electrode 45a disposed on the lower gate electrode 40. A thickness of the upper gate electrode 45a may be less than a thickness of the lower gate electrode 40.

The upper gate electrode 45a may be formed of a silicon material. For example, the upper gate electrode 45a may be formed of a doped polysilicon material. The lower gate electrode 40 may be formed of a metallic material having a resistivity lower than a resistivity of a material of the upper gate electrode 45a. For example, the lower gate electrode 40 may be formed of a metal nitride (e.g., TiN and WN) or a metal (e.g., W).

Figure 3B:
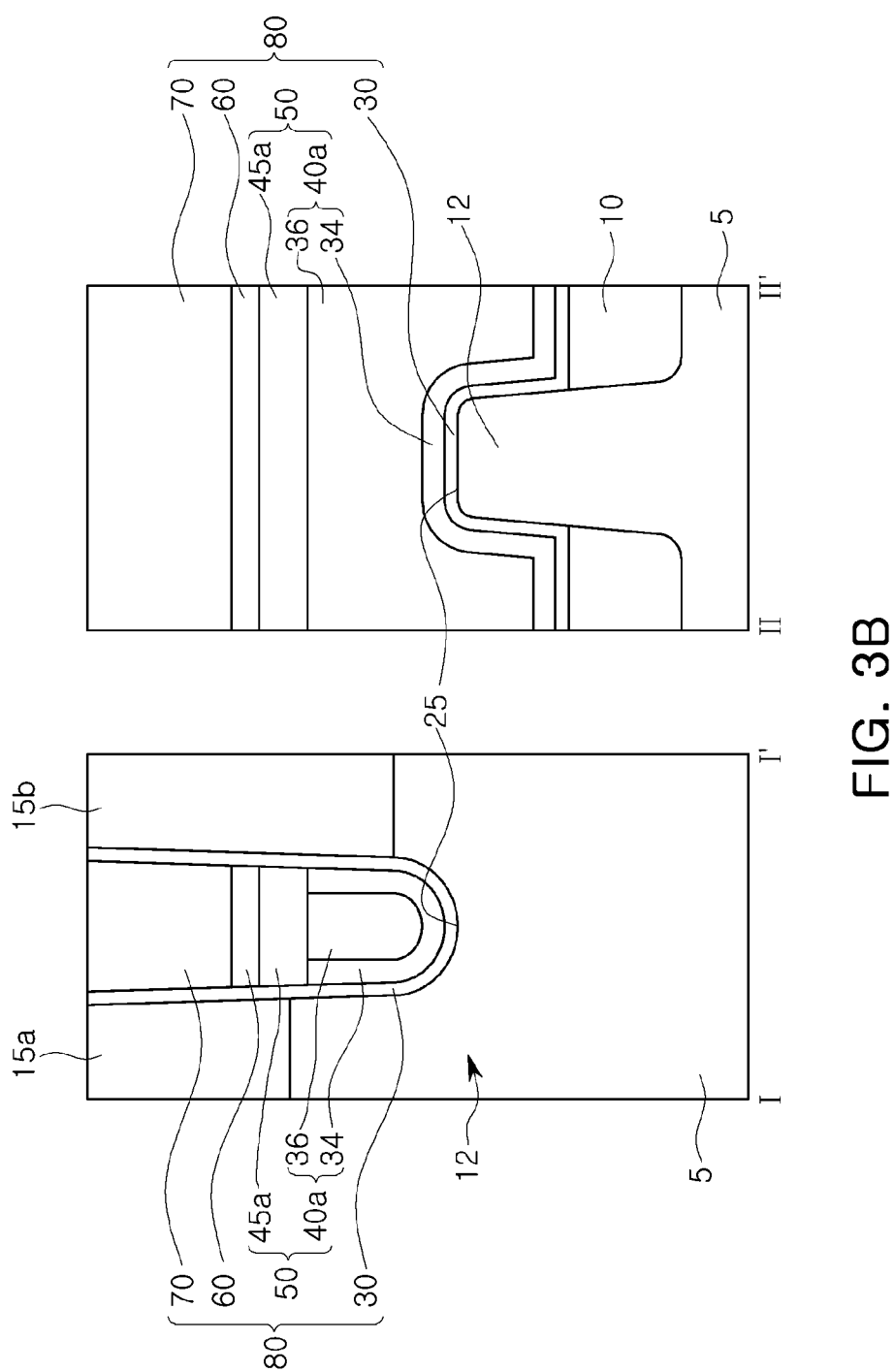
FIG. 3B is a cross-sectional view illustrating a modified example of a semiconductor device according to an example embodiment.

In a modified example, referring to FIG. 3B, the gate electrode 50 may include a lower gate electrode 40a and an upper gate electrode 45a disposed on the lower gate electrode 40a.

The lower gate electrode 40a may include a first lower gate electrode 34 and a second lower gate electrode 36. The first lower gate electrode 34 may be disposed between the second lower gate electrode 36 and an inner wall of the gate trench 25. The first lower gate electrode 34 may cover a bottom surface and a side surface of the second lower gate electrode 36. The first lower gate electrode 34 may be formed of a metal nitride (e.g., TiN and WN), and the second lower gate electrode 36 may be formed of a metal (e.g., W).

The upper gate electrode 45*a* may be in contact with a top surface of the first lower gate electrode 34 and a top surface of the second lower gate electrode 36. The upper gate electrode 45*a* may be formed of a silicon material. For example, the upper gate electrode 45*a* may be formed of a doped polysilicon material.

Figure 4:
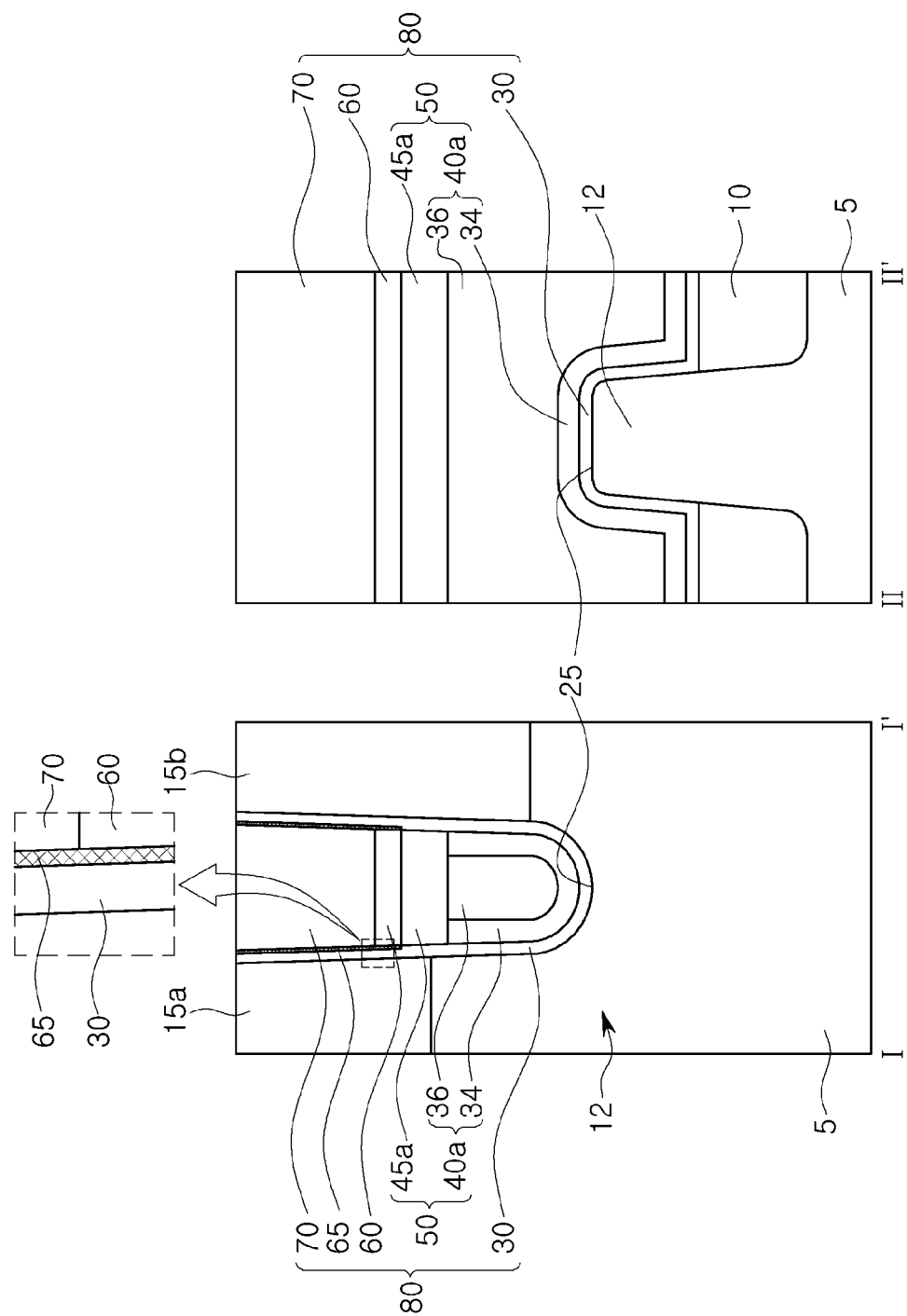
FIG. 4 is a cross-sectional view illustrating a modified example of a semiconductor device according to an example embodiment.

In a modified example, referring to FIG. 4, an insulating layer 65 may be disposed on the surface of the gate dielectric layer 30 adjacent to the gate capping insulating layer 60 and the gap-fill insulating layer 70. The insulating layer 65 may be formed by nitriding at least a portion of the gate dielectric layer 30. For example, the insulating layer 65 may be formed of a silicon oxynitride (SiON).

Figure 5:
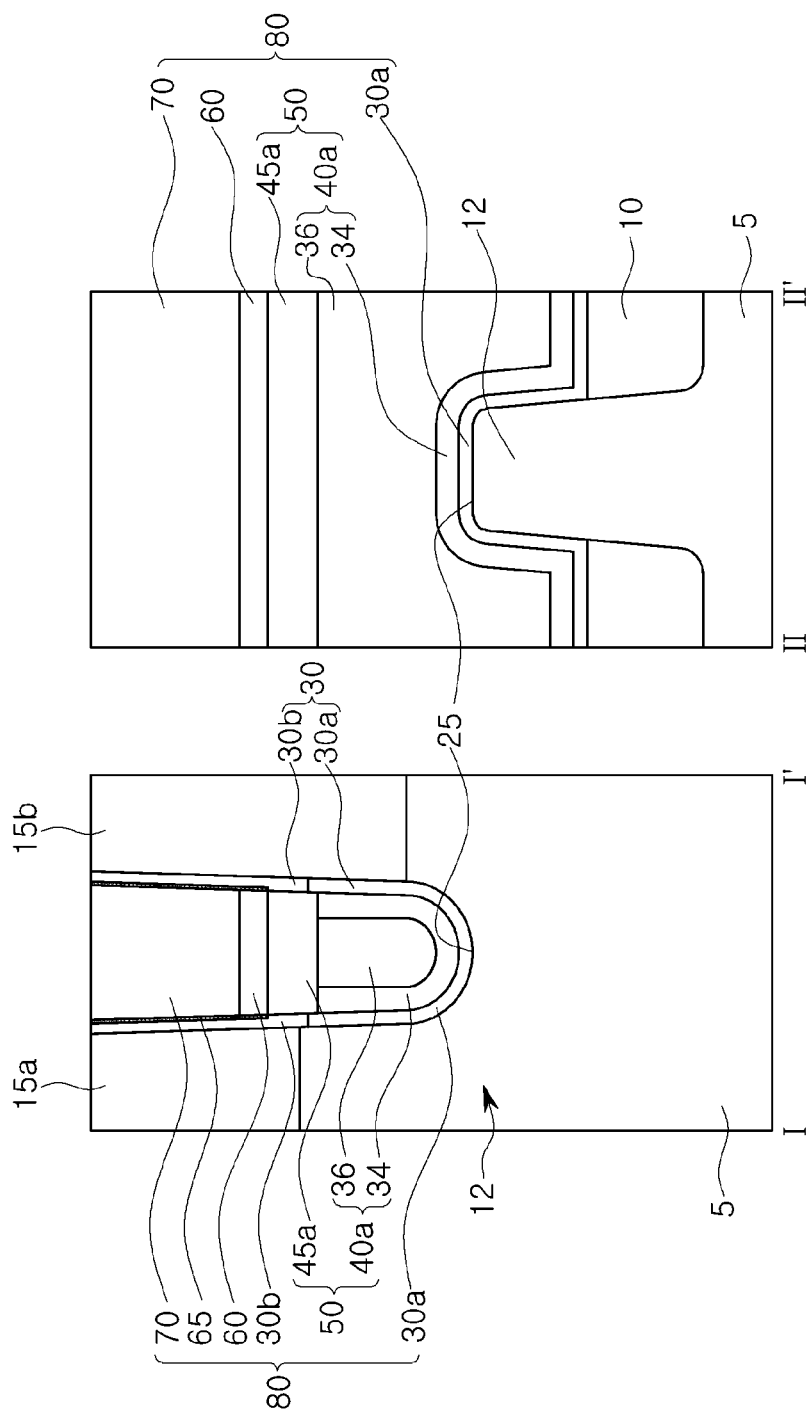
FIG. 5 is a cross-sectional view illustrating a modified example of a semiconductor device according to an example embodiment.

In a modified example, referring to FIG. 5, the gate dielectric layer 30' may include a first portion 30*a* and a second portion 30*b*'. The first portion 30*a* may cover the bottom surface and side surface of a portion of the gate electrode 50, and the second portion 30*b* may extend from the first portion 30*a* and cover the remaining side surface of the gate electrode 50, a side surface of the gate capping insulating layer 60, and a side surface of the gap-fill insulating layer 70.

The second portion 30*b* of the gate dielectric layer 30' may be a portion having a positive fixed charge. Such a positive fixed charge may serve to improve the device characteristics of a transistor. In an example, the second portion 30*b* of the gate dielectric layer 30' may further include a nitrogen element, as compared to the first portion 30*a*. As illustrated in FIG. 4, the insulating layer 65 may be disposed on the surface of the second portion 30*b* of the gate dielectric layer 30' adjacent to the gate capping insulating layer 60 and the gap-fill insulating layer 70.

Figure 6:
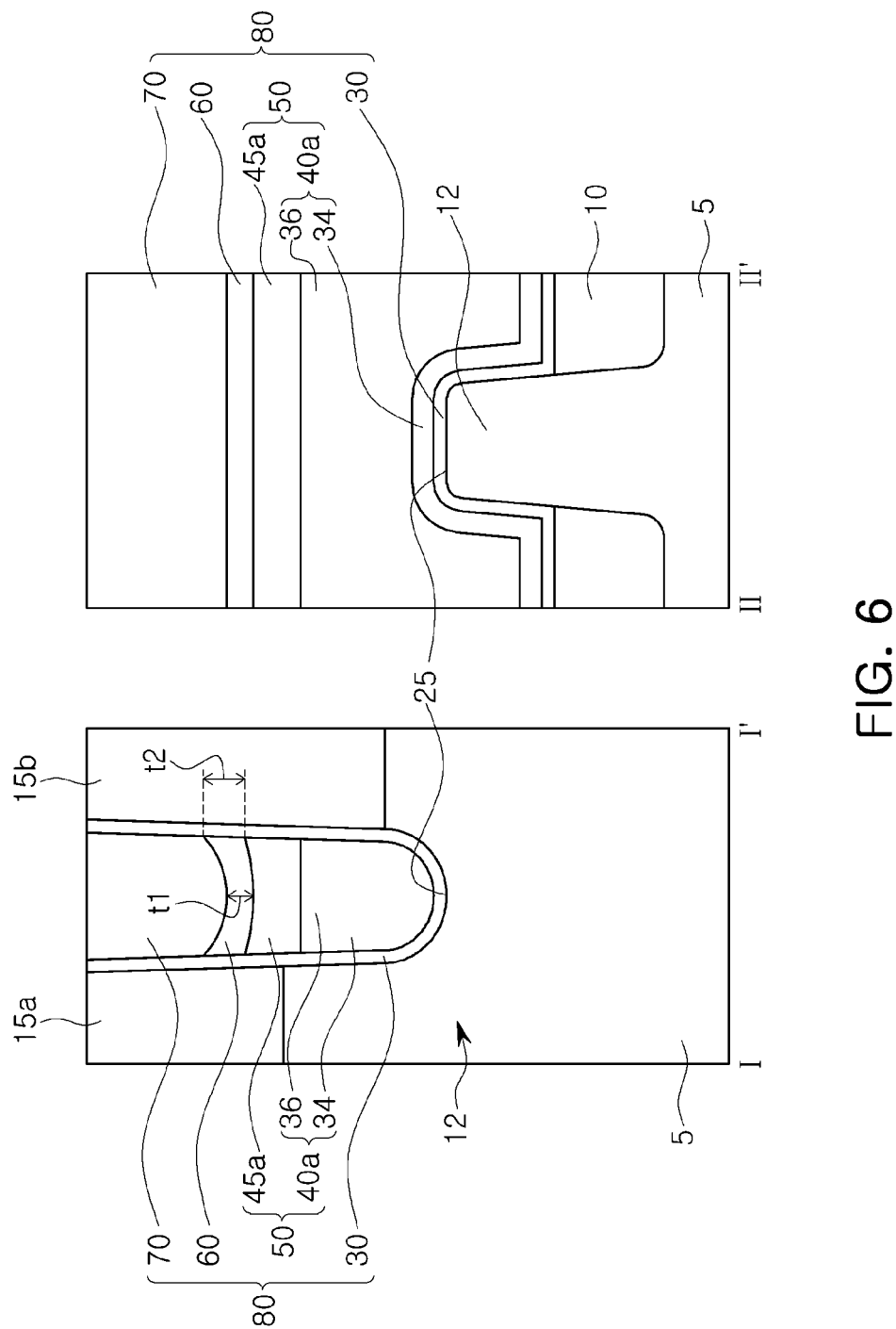
FIG. 6 is a cross-sectional view illustrating a modified example of a semiconductor device according to an example embodiment.

In a modified example, referring to FIG. 6, the gate capping insulating layer 60' may include a portion having a first thickness t1, and a portion having a second thickness t2 larger than the first thickness t1. For example, the gate capping insulating layer 60' may include a center portion having the first thickness t1, and an edge portion having the second thickness t2 larger than the first thickness t1. The edge portion of the gate capping insulating layer 60' may be a portion adjacent to the gate dielectric layer 30.

Although the description above is given with regard to a single active region 12 and a single gate structure 80, the scope of the inventive concept is not limited thereto. As an example, a modified example of a semiconductor device according to an example embodiment will be described with reference to FIG. 7.

Figure 7:
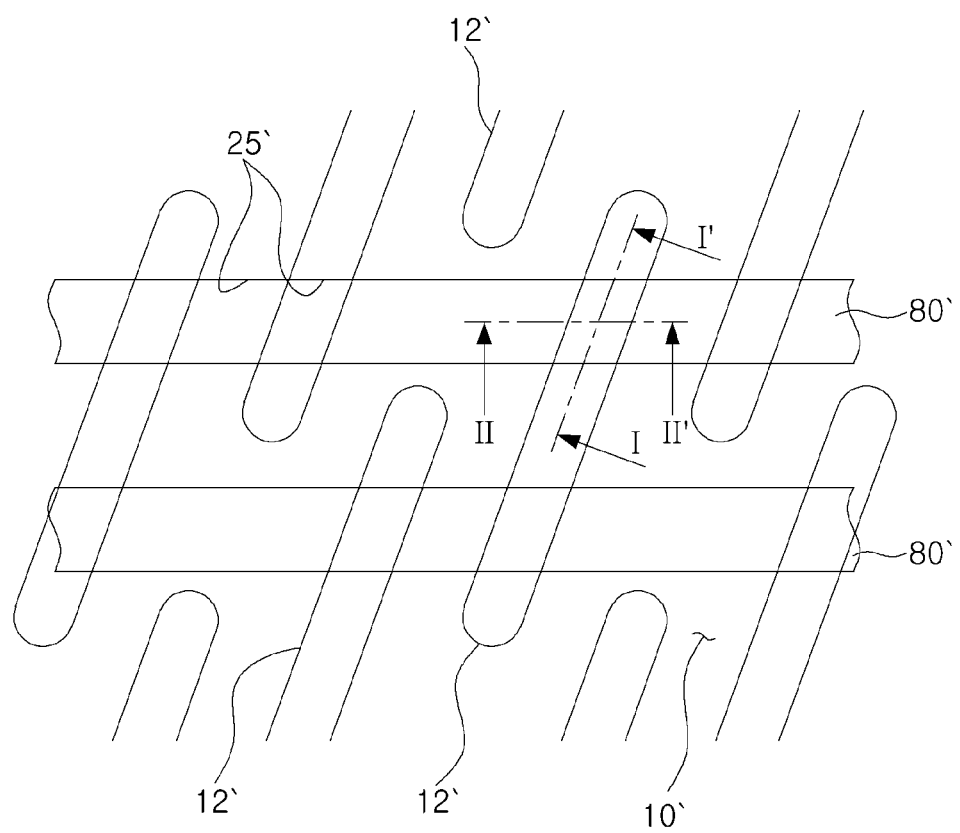
FIG. 7 is a plan view illustrating a modified example of a semiconductor device according to an example embodiment.

In a modified example, referring to FIG. 7, a plurality of active regions 12' spaced apart from each other may be disposed, a field region 10' defining the active regions 12' may be disposed, and a plurality of gate structures 80' crossing the active regions 12' and extending to the field region 10' may be disposed. For example, the gate structures 80' may be disposed in gate trenches 25' crossing the active regions 12' and extending to the field regions 10'. In FIG. 7, each of the regions taken along lines I-I' and II-II' may be the same as one of the cross-sectional views in FIG. 2, FIG. 3A, FIG. 3B, FIG. 4, FIG. 5, and FIG. 6. Accordingly, each of the gate structures 80' may be substantially identical to one of the gate structures 80 described with reference to FIG. 2, FIG. 3A, FIG. 3B, FIG. 4, FIG. 5, and FIG. 6.

Next, referring to FIG. 8 and FIG. 9 in conjunction with FIG. 7, a modified example of a semiconductor device according to an example embodiment will be described.

Figure 8:
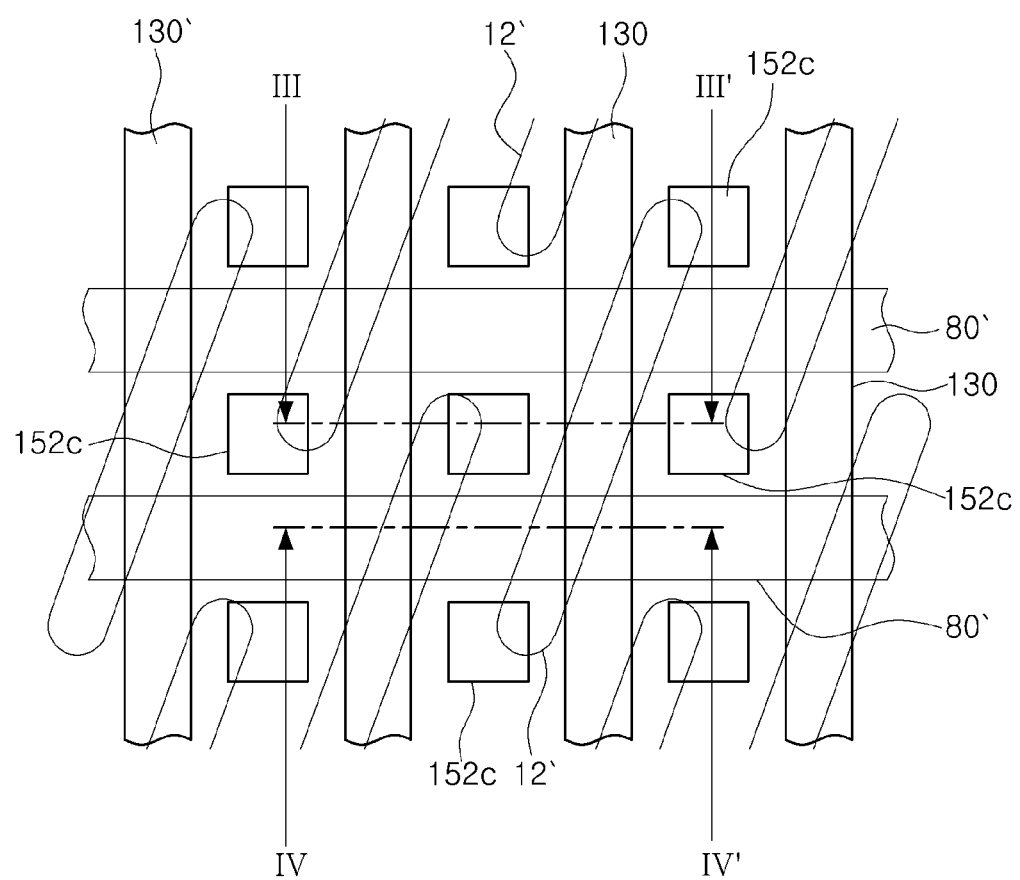
FIG. 8 is a plan view illustrating a modified example of a semiconductor device according to an example embodiment.
Figure 9:
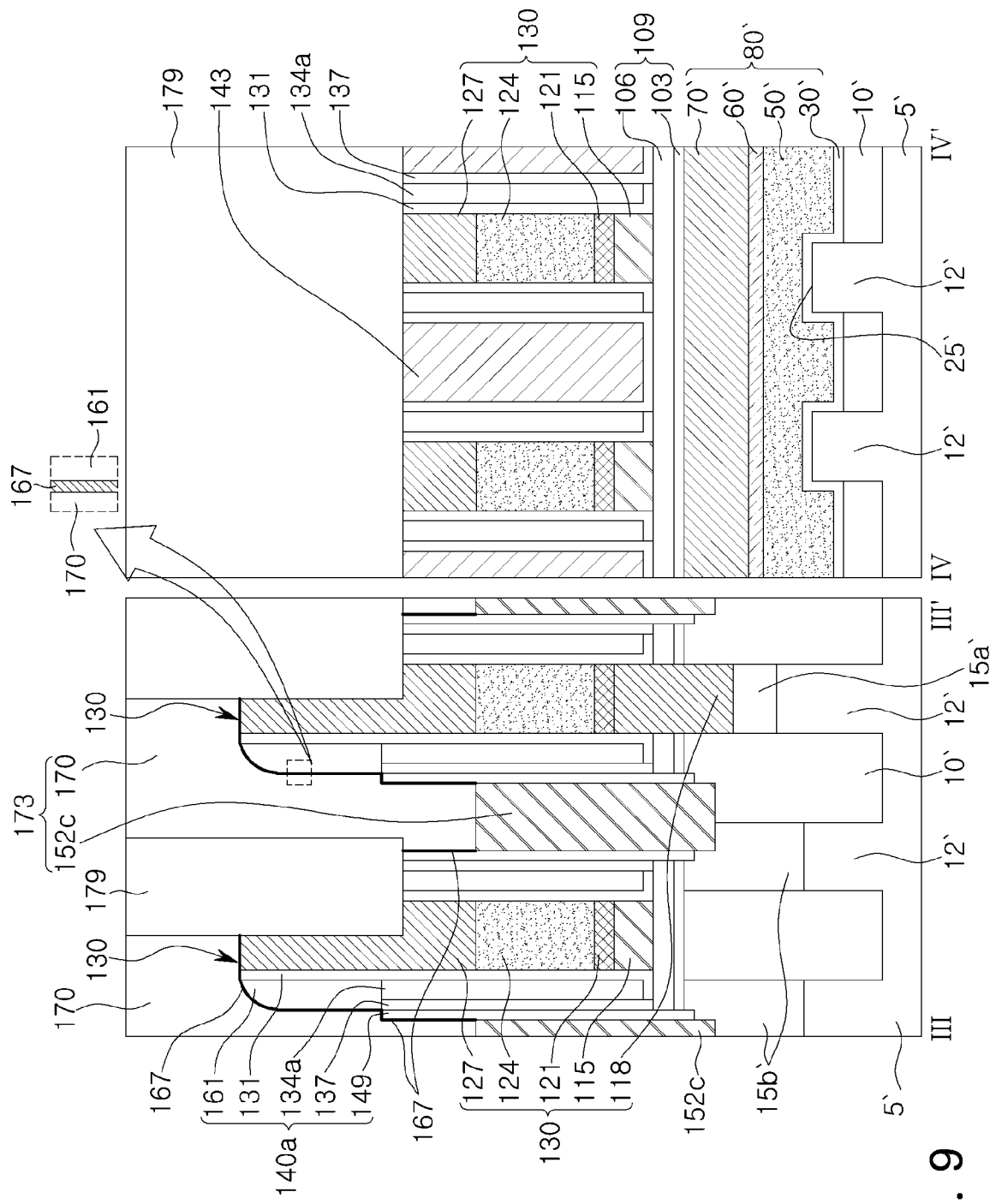
FIG. 9 is a cross-sectional view illustrating a modified example of a semiconductor device according to an example embodiment.

FIG. 8 is a plan view of a modified example of a semiconductor device according to an example embodiment, and FIG. 9 is a cross-sectional view taken along lines III-III' and IV-IV' of FIG. 8.

Referring to FIGS. 7 to 9, the active regions 12', the field region 10' defining the active regions 12', the gate trenches 25' crossing the active regions 12' and extending to the field region 10', and the gate structures 80' disposed in the gate trenches 25', as described with reference to FIG. 7, may be disposed on a semiconductor substrate 5'. The active region 10' may be substantially identical to the field region (indicated as 10 in FIG. 1 and FIG. 2) illustrated in FIG. 1 and FIG. 2.

Each of the gate structures 80' may include a gate dielectric layer 30', a gate electrode 50', a gate capping insulating layer 60', and a gap-fill insulating layer 70'. Each of the gate structures 80' may be substantially identical to one of the gate structures 80 described with reference to FIG. 2, FIG. 3A, FIG. 3B, FIG. 4, FIG. 5, and FIG. 6. For example, the gate dielectric layer 30' may be identical to the gate dielectric layer 30 described with reference to any one of FIGS. 2 to 6, the gate electrode 50' may be substantially identical to the gate electrode 50 described with reference to any one of FIGS. 2 to 6, the gate capping insulating layer 60' may be substantially identical to the gate capping insulating layer 60 described with reference to any one of FIGS. 2 to 6, and the gap-fill insulating layer 70' may be substantially identical to the gap-fill insulating layer 70 described with reference to any one of FIGS. 2 to 6. Since the gate dielectric layer 30', the gate electrode 50', the gate capping insulating layer 60', and the gap-fill layer 70' may be substantially identical to the gate dielectric layer 30, the gate electrode 50, the gate capping insulating layer 60, and the gap-fill layer 70, respectively, described above with reference to FIGS. 2 to 6, detailed descriptions thereof will be omitted for increased conciseness.

First and second impurity regions 15*a*' and 15*b*' may be disposed in the active regions 12'. The first and second impurity regions 15*a*' and 15*b*' may be source/drain regions. Similar to the first and second impurity regions (indicated as 15*a* and 15*b* in FIG. 2) described with reference to FIG. 2, the first impurity region 15*a*' may have a junction depth shallower than a junction depth of the second impurity region 15*b*'.

The gate dielectric layer 30', the gate electrode 50', and the first and second impurity regions 15*a*' and 15*b*' may form cell transistors.

Wiring structures 130 may be disposed in parallel with each other. For example, in some example embodiments, the wiring structures 130 may be disposed on the active regions 12', the field regions 10', and the gate structures 80'. The gate structures 80' may have a line shape, and the wiring structures 130 may have a line shape extending in a direction crossing over the gate structures 80'.

Each of the wiring structures 130 may include a portion overlapping the active regions 12' and a portion overlapping the field region 10'.

Each of the wiring structures 130 may include a contact interconnection pattern 118, a middle wiring pattern 121, an upper wiring pattern 124, and a wiring capping insulating pattern 127, sequentially stacked in the portion overlapping the active regions 12'. Each of the wiring structures 130 may include a lower wiring pattern 115, the middle wiring pattern 121, the upper wiring pattern 124, and the wiring capping insulating pattern 127, sequentially stacked in the portion overlapping the field region 10'.

The contact interconnection pattern 118, the lower wiring pattern 115, the middle wiring pattern 121, and the upper wiring pattern 124 may form a 'conductive wiring pattern'.

Of each of the wiring structures 130, the middle wiring pattern 121 and the upper wiring pattern 124 may extend continuously from the portion overlapping the active regions 12' to the portion overlapping the field regions 10'.

Of each of the wiring structures 130, the middle wiring pattern 121 may cover top surfaces of the contact interconnection pattern 118 and the lower wiring pattern 115.

The contact interconnection pattern 118 may be electrically connected to the first impurity region 15a'. In an example, the contact interconnection pattern 118 may be formed of polysilicon. The lower wiring pattern 115 may be formed of polysilicon, the middle wiring pattern 121 may be formed of a metal silicide (for example, tungsten silicide, etc.) and/or a metal nitride (for example, TiN or WN, etc.), the upper wiring pattern 124 may be formed of a metal material (for example, tungsten, etc.). The wiring capping insulating pattern 127 may be formed of a silicon nitride.

Insulating fences 143 spaced apart from each other may be disposed between the wring structures 130. The insulating fences 143 may overlap the gate structures 80'. The insulating fences 143 may be formed of a silicon nitride.

An interlayer insulating layer 109 may be disposed on the gate structures 80' and the field region 10. The interlayer insulating layer 109 may include a first interlayer insulating layer 103 and a second interlayer insulating layer 106 disposed on the first interlayer insulating layer 103. The first interlayer insulating layer 103 may be formed of a silicon oxide, and the second interlayer insulating layer 106 may be formed of a silicon nitride.

The interlayer insulating layer 109 may be disposed between the gate structures 80' and the wiring structures 130', between the gate structures 80' and the insulating fences 143, and between the wiring structures 130 and the field region 10'.

Contact structures 173 may be disposed between the wiring structures 130 and extend upwardly, as illustrated in FIG. 9. The contact structures 173 may be spaced apart from each other. Each of the contact structures 173 may include a lower contact pattern 152c and an upper contact pattern 170 disposed on the lower contact pattern 152c. The lower contact pattern 152c may be formed of silicon, for example, polysilicon. The second impurity region 15b' may be disposed underneath the lower contact pattern 152c and electrically connected to the lower contact pattern 152c. The upper contact pattern 170 may be formed of a metallic material, and for example, may be formed of a metal silicide (e.g., TiSi, NiSi, and CoSi), a metal nitride (e.g., Ti), a metal (e.g., W), or a combination thereof.

The upper contact pattern 170 may include a lower portion disposed between the wiring structures 130 and in contact with the lower contact pattern 152c, and may include an upper portion extending upwardly from the lower portion and extending onto a top surface of one of the wiring structures 130 that is adjacent to the upper contact pattern 170, as illustrated in FIG. 9. Accordingly, one such upper contact pattern 170 may include a portion overlapping a top surface of one of the wiring structures 130 adjacent to each other, and may extend between the wiring structures 130 and come in contact the second impurity region 15b'.

An upper insulating pattern 179 may be located at a higher level than the lower contact patterns 152c and extend downwardly, filling between the upper contact patterns 170 located at a higher level than the wiring structures 130. The upper insulating pattern 179 may extend downwardly, overlapping a portion of each of the wiring capping insulating patterns 127 of the wiring structures 130. A width of each of the wiring capping insulating patterns 127 located at the same height as the upper insulating pattern 179 (i.e., a portion of the wiring capping insulating pattern 127 adjacent to a portion of the upper insulating pattern 179) may be less than a width of each of the wiring capping insulating patterns 127 located under the upper insulating pattern 179 (i.e., a portion of the wiring capping insulating pattern 127 below the upper insulating pattern 179).

Insulating spacers 140a may be disposed between the wiring structures 130 and the contact structures 173. The insulating spacers 140a may include a first spacer layer 131, an air gap 134a, a second spacer layer 137, a third spacer layer 149, and an upper spacer 161. The first to third spacer layers 131, 137, and 149, and the upper spacer 161 may be formed of a nitride-based insulating material, for example a silicon nitride.

The first spacer layer 131 may cover a top surface of the interlayer insulating layer 109 and cover side surfaces of the wiring structures 130.

The upper spacer 161 may be disposed between the upper contact patterns 170 and upper regions of the wiring capping insulating patterns 127.

The second spacer layer 137 may be disposed between the upper contact patterns 170 and the first spacer layer 131 on the interlayer insulating layer 109, and may be disposed between the insulating fences 143 and the first spacer layer 131. The air gap 134a may be disposed between the first spacer layer 131 and the second spacer layer 137. At least a portion of the air gap 134a may be disposed between the lower contact pattern 152c and the wiring structures 130. The third spacer layer 149 may be interposed between the contact structure 173 and the second spacer layer 137 and extend between the interlayer insulating layer 109 and the lower contact pattern 152c.

An insulating layer 167 may be disposed on surfaces of the insulating spacers 140a adjacent to the upper contact pattern 170. The insulating layer 167 may extend onto top surfaces of the wiring capping insulating patterns 127 overlapping the upper contact pattern 170.

The first to third spacer layers 131, 137, and 149, the upper spacer 161, and the wiring capping insulating patterns 127 may be formed of a nitride-based insulating material, for example a silicon nitride. The insulating layer 167 may be a material formed by oxidizing the nitride-based insulating material, for example a silicon nitride. For example, the insulating layer 167 may be formed of a silicon oxynitride (SiON) formed by oxidizing a silicon nitride. The insulating layer 167 may be interposed between the upper contact pattern 170 and the insulating spacers 140a, and may extend onto a top surface of the wiring capping insulating pattern 127. The lower contact pattern 152c may include a portion in direct contact with the insulating spacers 140a.

Next, referring FIG. 10 and FIGS. 11A to 11C, a method of forming a semiconductor device according to an example embodiment will be described. FIG. 11A to FIG. 11C are cross-sectional views illustrating portions taken along lines I-I' and II-II' of FIG. 1.

Figure 10:
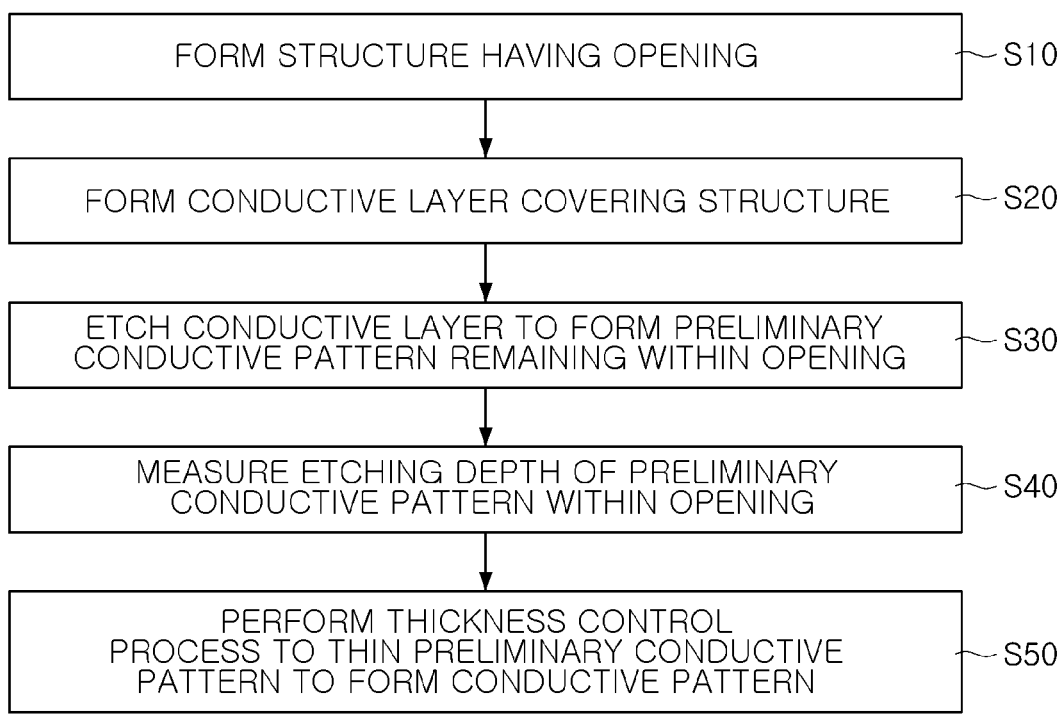
FIG. 10 is a process flowchart illustrating an example of a method of forming a semiconductor device according to an example embodiment.
Figure 11A:
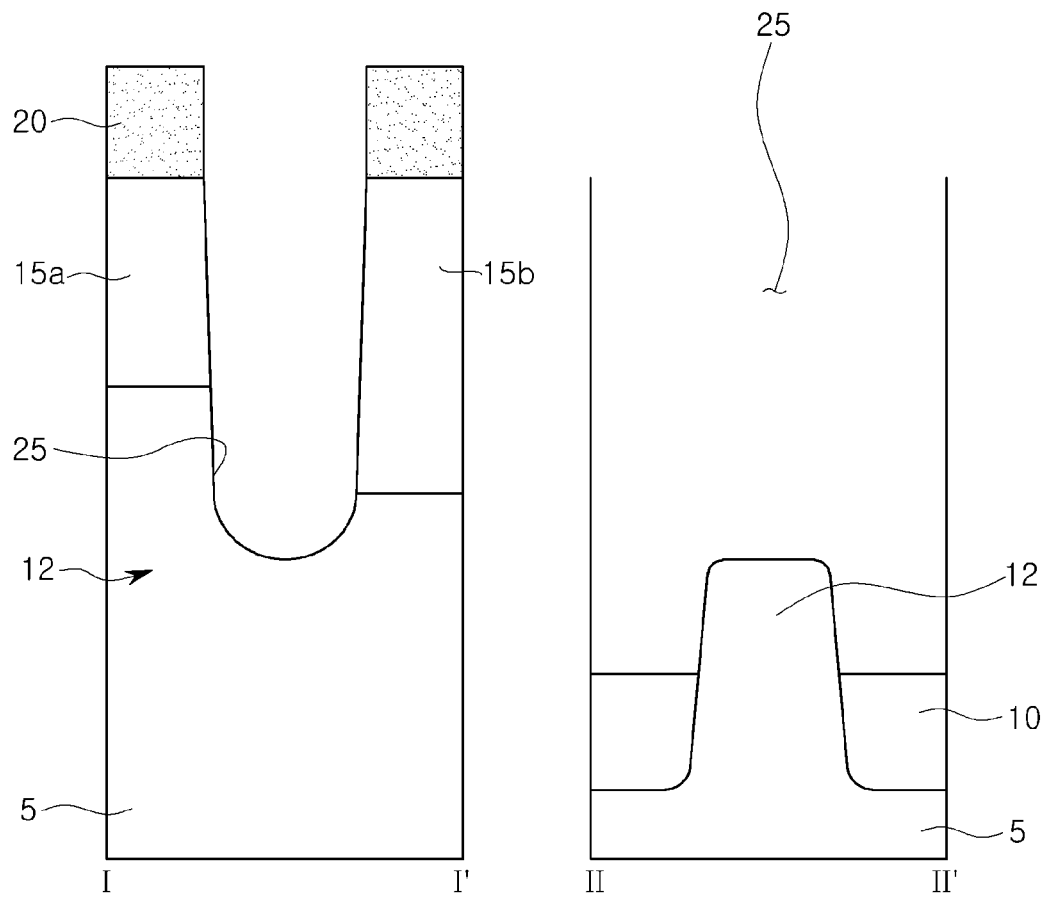
FIGS. 11A to 11C are cross-sectional views illustrating a modified example of a method of forming a semiconductor device according to an example embodiment.
Figure 11B:
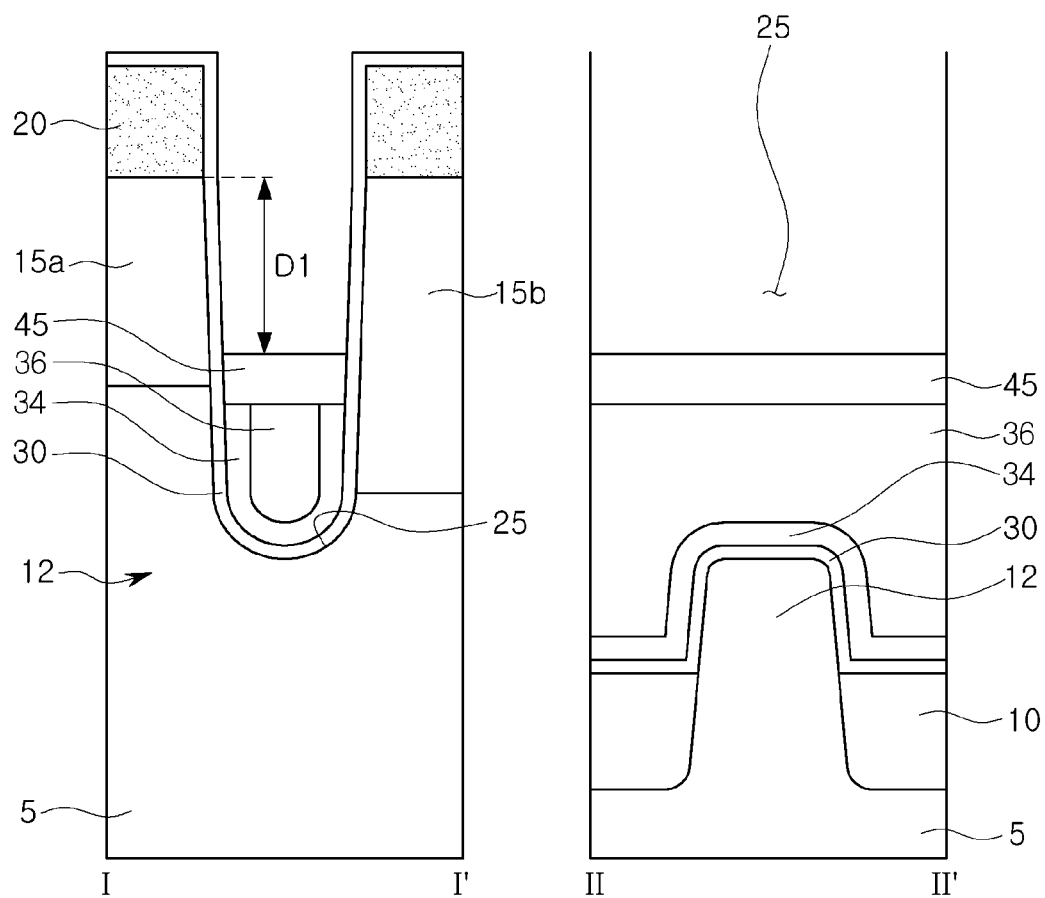
Figure 11C:
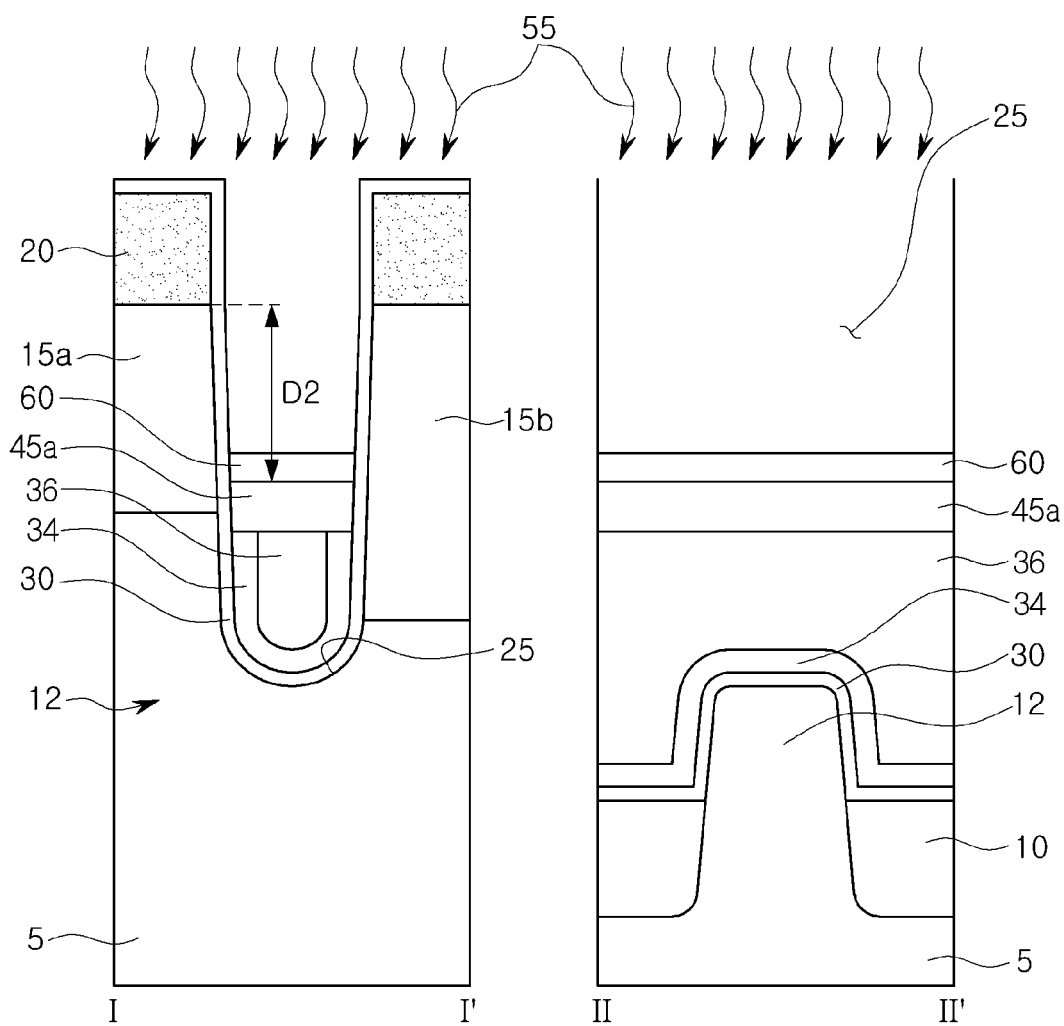

Referring to FIG. 1, FIG. 10, and FIG. 11A, a structure having an opening may be formed in S10. For example, a gate trench 25 may be formed by forming a field region 10 defining an active region 12, forming a mask pattern 20, and etching the active region 12 and the field region 10 by using the mask pattern 20 as an etching mask. Accordingly, the opening may be the gate trench 25.

Before forming the gate trench 25, an ion implantation process may be performed to form the first impurity region 15a and the second impurity region 15b in the active region 12. The gate trench 25 may be formed to cross between the first and second impurity regions 15a and 15b.

Referring to FIG. 1, FIG. 10, and FIG. 11B, a gate dielectric layer 30 may be formed to conformally cover an inner wall of the gate trench 25. Subsequently, a conductive layer may be formed to cover a structure in S20. Subsequently, the conductive layer may be etched to form a preliminary conductive pattern within the opening in S30. For example, a first lower gate electrode 34 and a second lower gate electrode 36 within the gate trench 25 may be formed by conformally forming a first lower conductive layer on the gate dielectric layer 30, forming a second lower conductive layer on the first lower conductive layer to fill the gate trench 25, and etching the first and second lower conductive layers. The first lower gate electrode 34 may be formed to cover a bottom surface and a side surface of the second lower gate electrode 36. Subsequently, a preliminary conductive pattern 45 within the gate trench 25 may be formed by forming an upper conductive layer on the first and second lower gate electrodes 34 and 36, and etching the upper conductive layer.

Next, an etching depth of the preliminary conductive pattern within the opening may be measured in S40. For example, an etching depth D1 of the preliminary conductive pattern 45 within the gate trench 25 may be measured. The etching depth D1 may be a recessed depth in the preliminary conductive pattern 45 that is recessed from an upper surface of the active region 12 into the gate trench 25.

Referring to FIG. 1, FIG. 10, and FIG. 11C, a thickness control process may be performed, based on the measured etching depth, to thin the preliminary conductive pattern to form a conductive pattern in S50. For example, a thickness control process 55 may be performed, based on the measured etching depth D1, to thin the preliminary conductive pattern (indicated as 45 in FIG. 11B) to form a conductive pattern having a reference thickness, for example, an upper gate electrode 45a. For example, in some cases, the measured etching depth may be within a tolerance range of the reference thickness, but in others, due to process variations, the measured etching depth may indicate that additional thinning is to be performed using the thickness control process.

The preliminary conductive pattern (indicated as 45 in FIG. 11B) may be formed of a silicon material, for example a polysilicon material. Accordingly, the upper gate electrode 45a may be formed of a silicon material.

In the thickness control process 55, a difference in thickness between the a thickness of the final upper gate electrode 45a and a thickness of the preliminary conductive pattern (indicated as 45 in FIG. 11B) may be obtained using information on the recessed depth (indicated as D1 in FIG. 11B). That is, the thickness of the final upper gate electrode 45a may be the reference thickness.

In example embodiments, the preliminary conductive pattern (indicated as 45 in FIG. 11B) may be formed with a thickness larger than a reference thickness of the final upper gate electrode 45a, and then, by using the thickness control process 55, the preliminary conductive pattern (indicated as 45 in FIG. 11B) may be thinned to form the upper gate electrode 45a having the reference thickness. The reference thickness may be set in advance. Accordingly, a difference in height D2 between a top surface of the active region 12 and a top surface of the upper gate electrode 45a may be greater than a difference in height D1 between a top surface of the active region 12 and a top surface of the preliminary conductive pattern 45.

In example embodiments, the thickness control process 55 may be an oxidization process, a nitriding process, or a process of performing both an oxidization process and a nitriding process. The oxidation process and/or nitriding process of the thickness control process 55 may precisely control the thickness of the preliminary conductive pattern (indicated as 45 in FIG. 11B) to form the upper gate electrode 45a having a reference thickness.

The preliminary conductive pattern (indicated as 45 in FIG. 11B) may be oxidized and/or nitrided by the thickness control process 55 to form the gate capping layer 60. Accordingly, the gate capping layer 60 may be formed of a silicon oxide, a silicon nitride, or a silicon oxynitride. For example, when the preliminary conductive pattern (indicated as 45 in FIG. 11B) is thinned through an oxidation process, the gate capping layer 60 may be formed of a silicon oxide. When the preliminary conductive pattern (as indicated 45 in FIG. 11B) is thinned through a nitriding process, the gate capping layer 60 may be formed of a silicon nitride. When the preliminary conductive pattern (indicated as 45 in FIG. 11B) is thinned through both an oxidation process and a nitriding process, the gate capping layer 60 may be formed of a silicon oxynitride.

Referring to FIG. 1 and FIG. 3B, the gap-fill insulating layer 70 may be formed on the gate capping insulating layer 60, and the gap-fill insulating layer 70 may be planarized. By planarizing the gap insulating layer 70, the gap-fill insulating layer 70 may remain in the gate trench 25. The mask pattern (indicated as 20 in FIG. 11C) may be removed. Accordingly, the gate structure 80 may be formed to include the gate dielectric layer 30, the gate electrode 50, the gate capping insulating layer 60, and the gap-fill insulating layer 70, described above.

Next, referring to FIG. 12A to FIG. 12G, a method of forming a semiconductor device according to an example embodiment will be described. FIG. 12A to FIG. 12G are cross-sectional views of portions taken along lines III-III' and IV-IV' of FIG. 8.

Figure 12A:
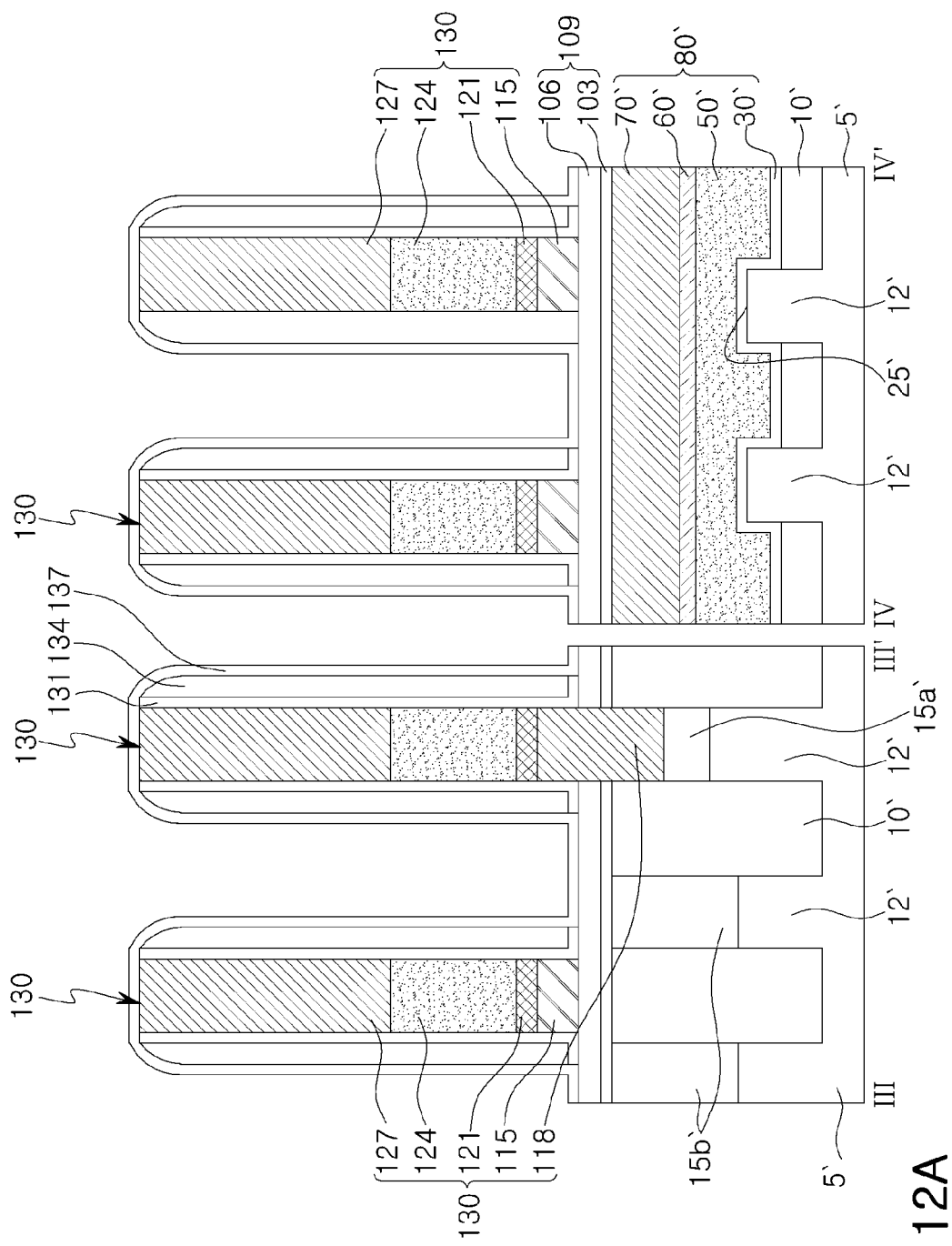
FIGS. 12A to 12G are cross-sectional views illustrating a modified example of a method of forming a semiconductor device according to an example embodiment.

Referring to FIG. 8 and FIG. 12A, a method described with reference to FIG. 11A to FIG. 11C, may be used to form, on a semiconductor 5', the field region 10' defining the active regions 12', the gate trenches 25' crossing the active regions 12' and extending into the field region 10', and the gate structures 80' in the gate trenches 25'. Each of the gate trenches 25' may include the gate dielectric layer 30', the gate electrode 50', the gate capping insulating layer 60', and the gap-fill insulating layer 70'.

An interlayer insulating layer 109 may be formed on the gate structures 80', the active regions 12', and the field region 10'. The interlayer insulating layer 109 may include a first interlayer insulating layer 103 and a second interlayer insulating layer 106, sequentially formed.

The wiring structures 130 may be formed in parallel to each other. Forming the wiring structures 130 may include forming a lower wiring layer on the interlayer insulating layer 109, forming a contact interconnection pattern 118 passing through the lower wiring layer and the interlayer insulating layer 109 and electrically connected to the first impurity region 15a, forming a middle wiring layer, an upper wiring layer, and a wiring capping layer, sequentially stacked on the lower wiring layer and the contact interconnection pattern 118, and patterning the lower wiring layer, the contact interconnection pattern 118, the middle wiring layer, the upper wiring layer, and the wiring capping insulating layer. The wiring capping insulating layer may be formed into a wiring capping insulating pattern 127, the upper wiring layer may be formed into an upper wiring pattern 124, the middle wiring pattern may be formed into a middle wiring pattern 121, and the lower wiring layer may be formed into a lower wiring pattern 115. Accordingly, each of the wiring structures 130 may include, in a portion thereof overlapping the active regions 12', the contact interconnection pattern 118, the middle wiring pattern 121, the upper wiring pattern 124, and the wiring capping insulating pattern 127 that are sequentially stacked. Each of the wiring structures 130 may include, in a portion thereof overlapping the field region 10', the lower wiring pattern 115, the middle wiring pattern 121, the upper wiring pattern 124, and the wiring capping insulating pattern 127 that are sequentially stacked.

Next, a first spacer layer 131 and a sacrificial spacer layer 134 may be sequentially stacked on side surfaces of the wiring structures 130. Sequentially, a second spacer layer 137 may be formed conformally on the semiconductor substrate having the first spacer layer 131 and the sacrificial spacer layer 134.

Figure 12B:
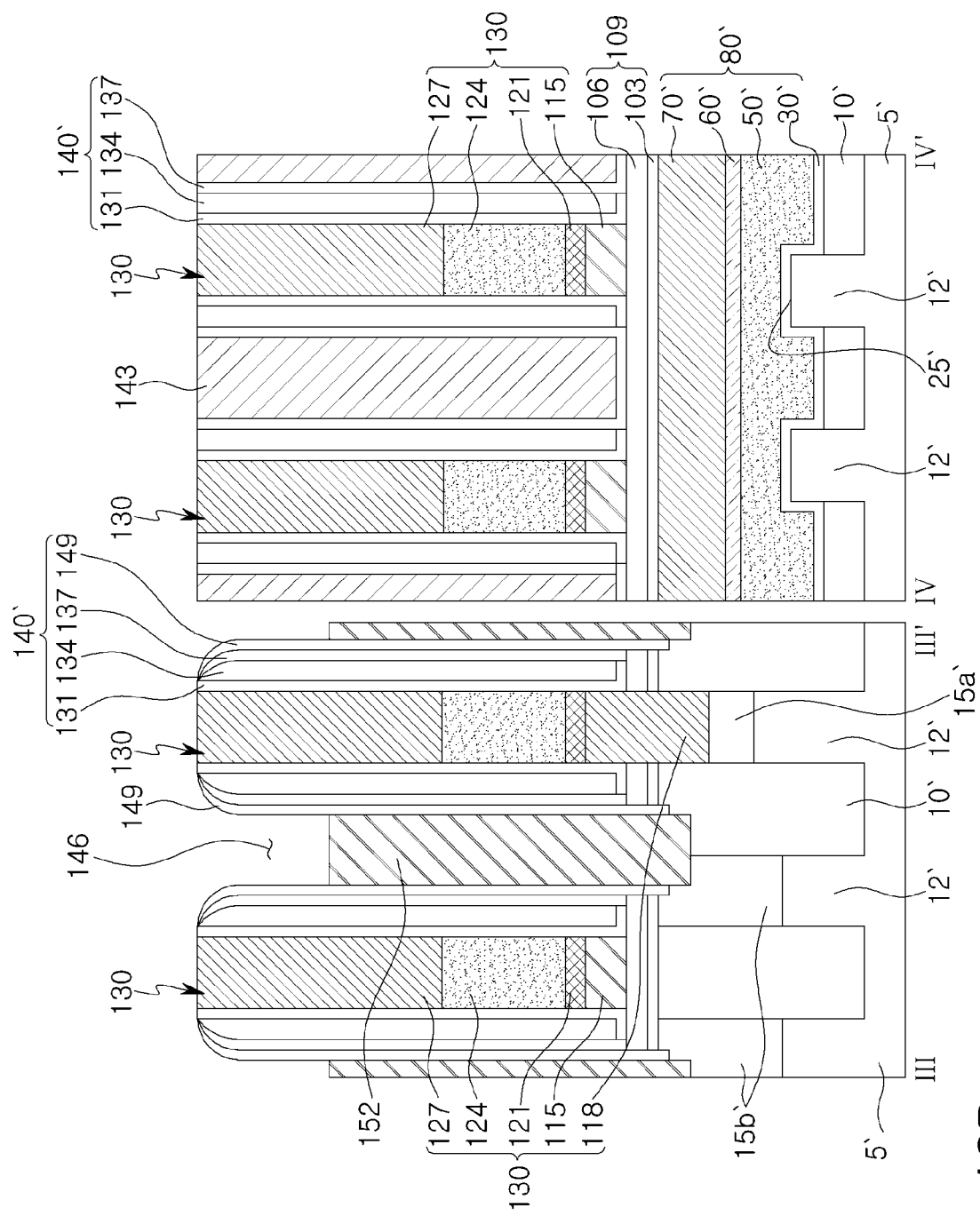

Referring to FIG. 8 and FIG. 12B, insulating fences 143 may be formed on the gate structures 80' and between the wiring structures 130. Contact holes 146, which are the openings between the wiring structures 130 and the insulating fences 143, may be formed. Forming the contact holes 146 may include forming the third spacer layer 149 conformally, and performing an etching process to penetrate the interlayer insulating layer 109 to have the second impurity region 15b' exposed. Accordingly, the first spacer layer 131, the sacrificial spacer layer 134, the second spacer layer 137, and the third spacer layer 149 may form a preliminary spacer 140'.

A preliminary conductive pattern 152 may be formed to partially fill the contact holes 146. The preliminary conductive pattern 152 may be formed of polysilicon.

Figure 12C:
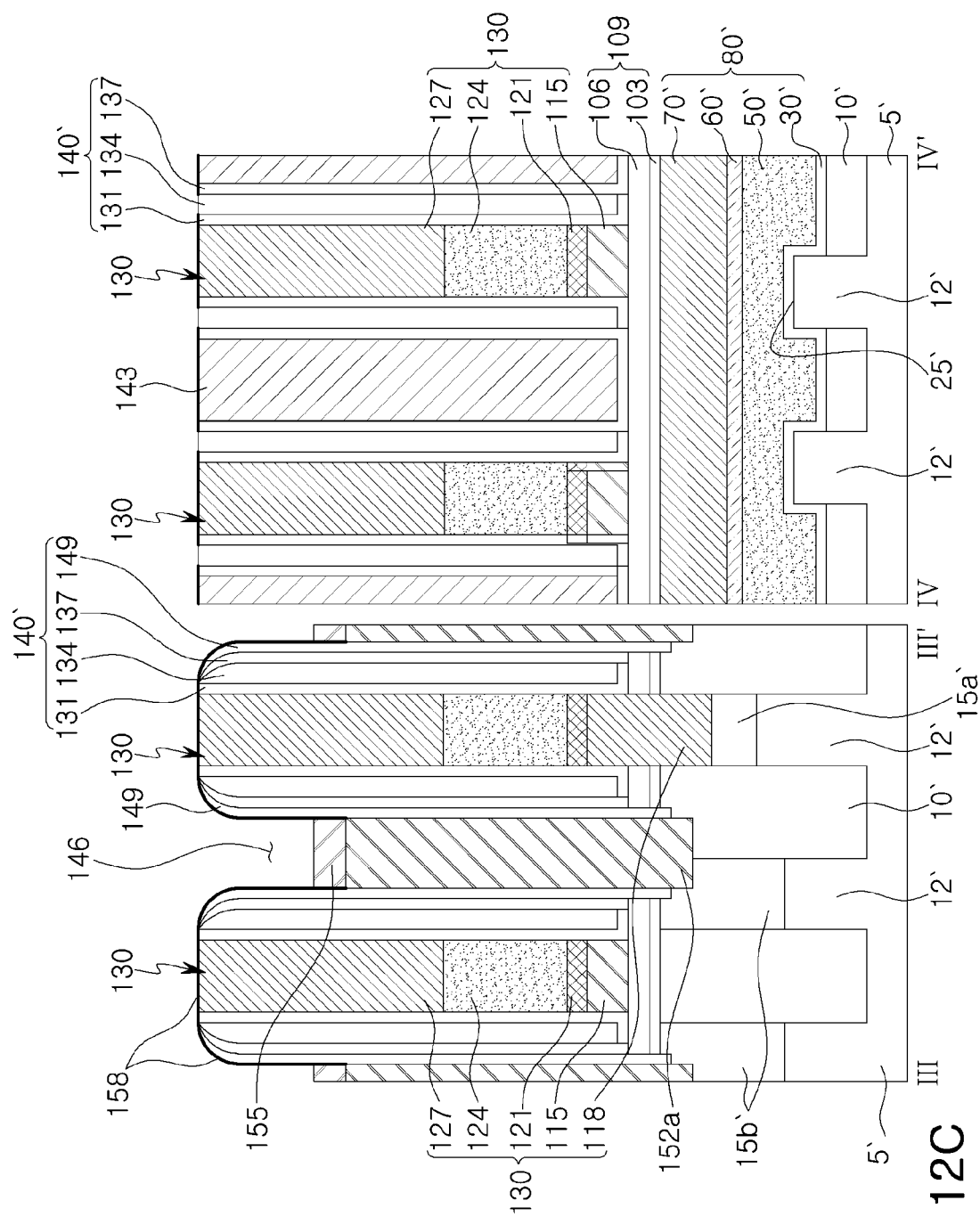

Referring to FIG. 8 and FIG. 12C, the thickness control process (indicated as 55 in FIG. 11C) illustrated in FIG. 11C may be performed to form the sacrificial layer 155 and thin the preliminary conductive pattern 152, thus forming a thinned preliminary conductive pattern 152a.

The sacrificial capping layer 155 may be formed of a silicon oxide. As the sacrificial capping layer 155 is formed, an insulating layer 158 may be formed. The insulating layer 158 may be formed on a silicon nitride surface exposed by the thickness control process and located at a higher level than the preliminary conductive pattern 152. Accordingly, the insulating layer 158 may be formed on the surface of the third spacer layer 149, the surface of the wiring capping insulating pattern 127, and the surfaces of the insulating fences 143, which may be formed of a silicon nitride and located at a higher level than the preliminary conductive pattern 152.

Figure 12D:
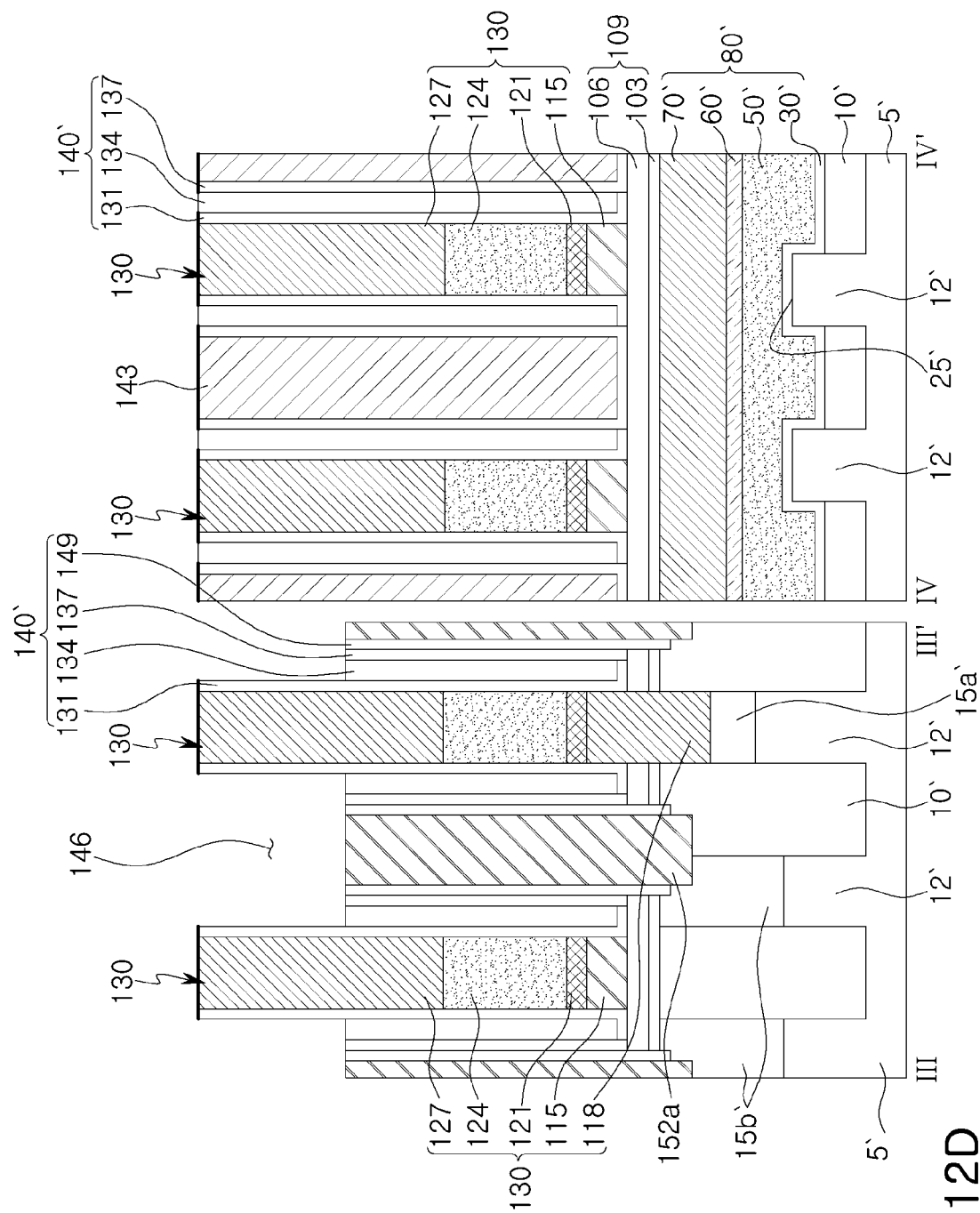

Referring to FIG. 8 and FIG. 12D, the third spacer layer 149, the second spacer layer 137, and the sacrificial spacer layer 134, located in the contact holes 146 and at a higher level than the preliminary conductive pattern 152a having been thinned as the sacrificial capping layer 155 is removed, may be removed.

Figure 12E:
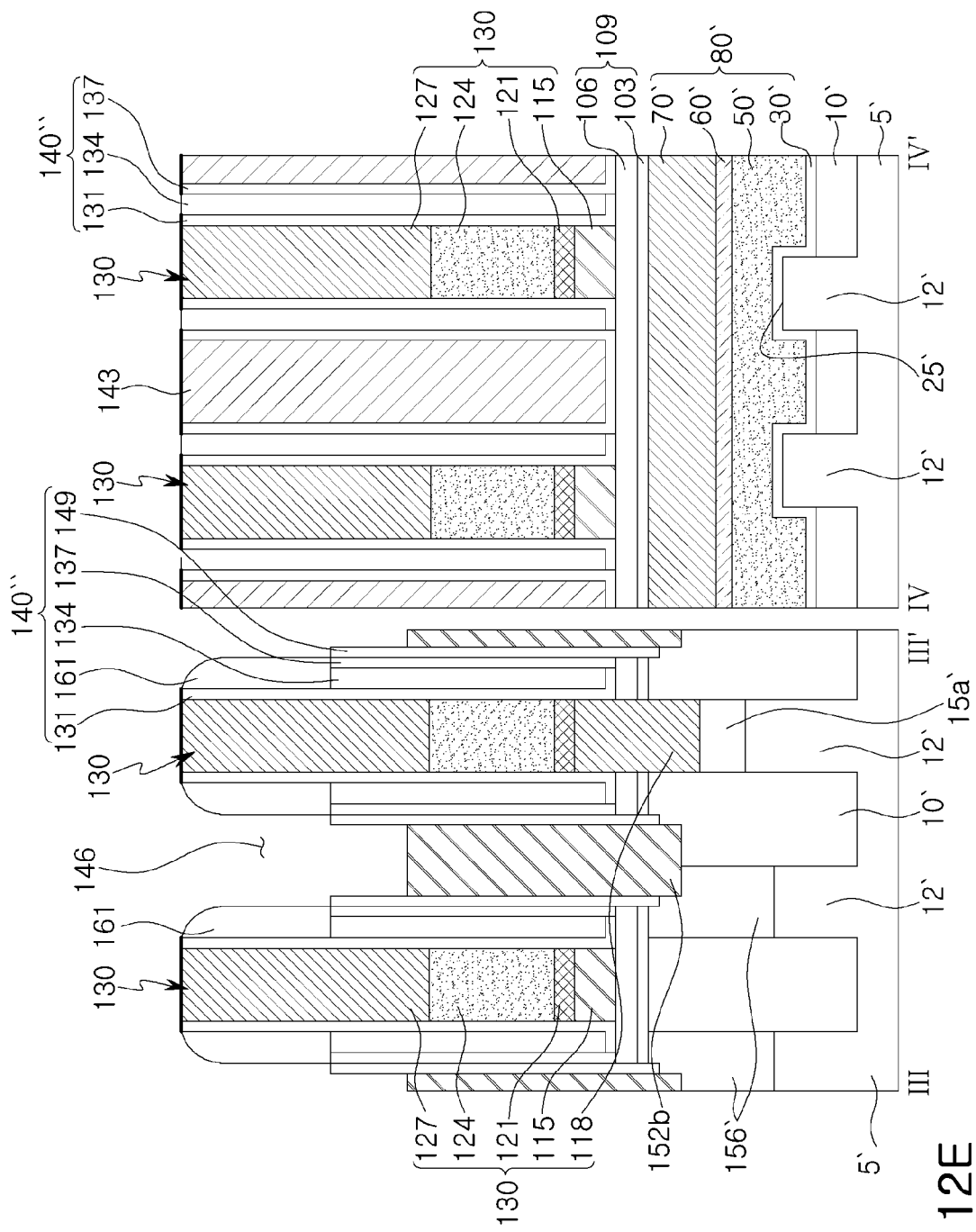

Referring to FIG. 8 and FIG. 12E, an upper spacer 161 may be formed on side surfaces of upper regions of the wiring structures 130. Subsequently, the thinned preliminary conductive pattern 152a may be etched to form a thinned preliminary conductive pattern 152b. Accordingly, the preliminary spacer (indicated as 140' in FIG. 12D) may be formed into a preliminary spacer 140" further including the upper spacer 161.

Figure 12F:
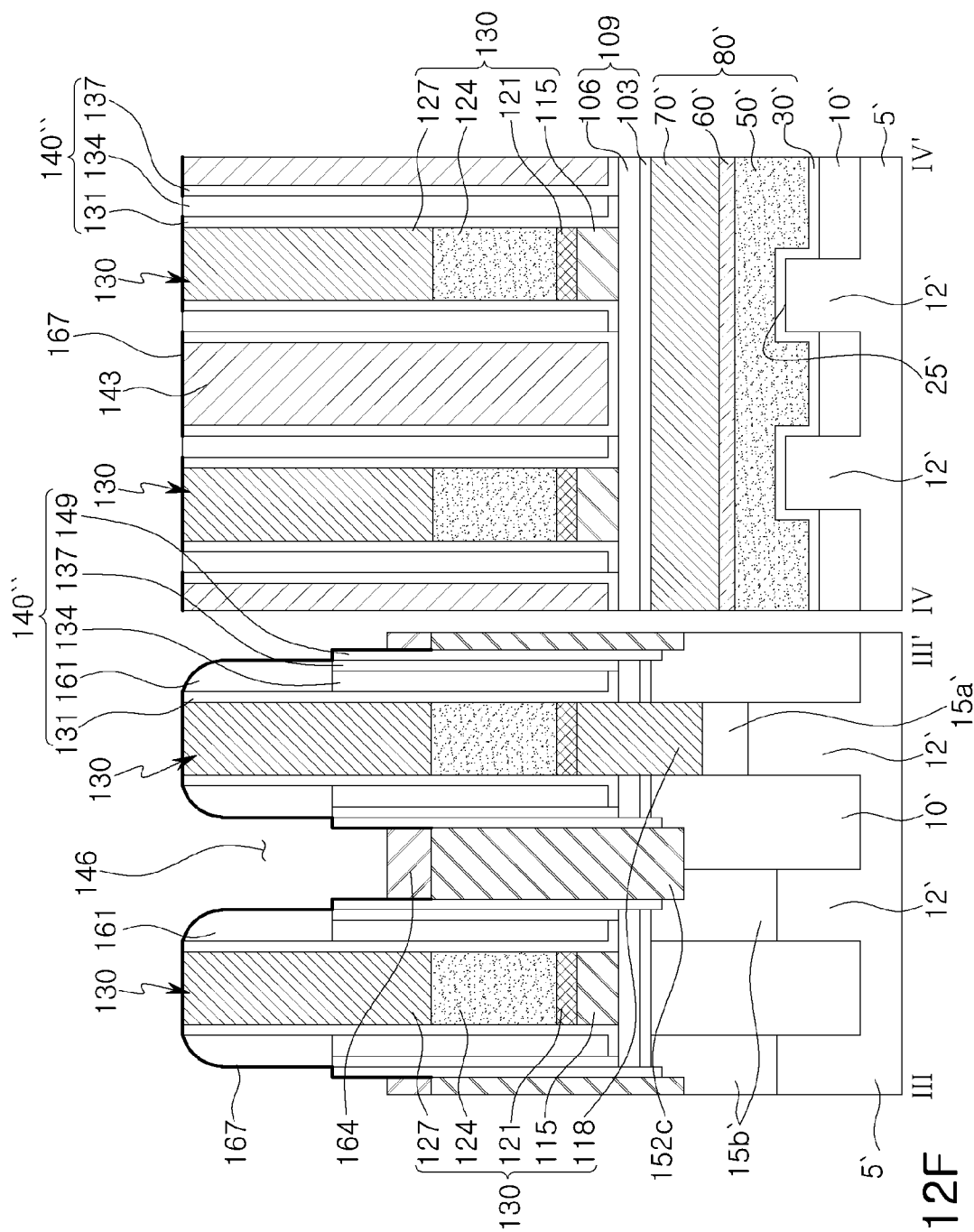

Referring to FIG. 8 and FIG. 12F, as a sacrificial capping layer 164 is formed through the thickness control process (indicated as 55 in FIG. 11C) illustrated in FIG. 11C, the thinned preliminary conductive pattern (indicated as 152b in FIG. 12E) may be further thinned to form a thinned conductive pattern, a lower contact pattern 152c.

The sacrificial capping layer 164 may be formed of a silicon oxide. An insulating layer 167 may be formed as the sacrificial capping layer 164 is formed. The insulating layer 167 may be formed on a silicon nitride surface exposed through the thickness control process and located at a higher level than the lower contact pattern 152. Accordingly, the insulating layer 167 may be formed on the surface of the third spacer layer 149, the surface of the upper spacer 161, the surface of the wiring capping insulating pattern 127, and the surfaces of the insulating fences 143, which may be formed of a silicon nitride and located at a higher level than the lower contact pattern 152. The insulating layer 167 may be formed of a silicon oxynitride (SiON) which can be formed through the oxidation of a silicon nitride.

Figure 12G:
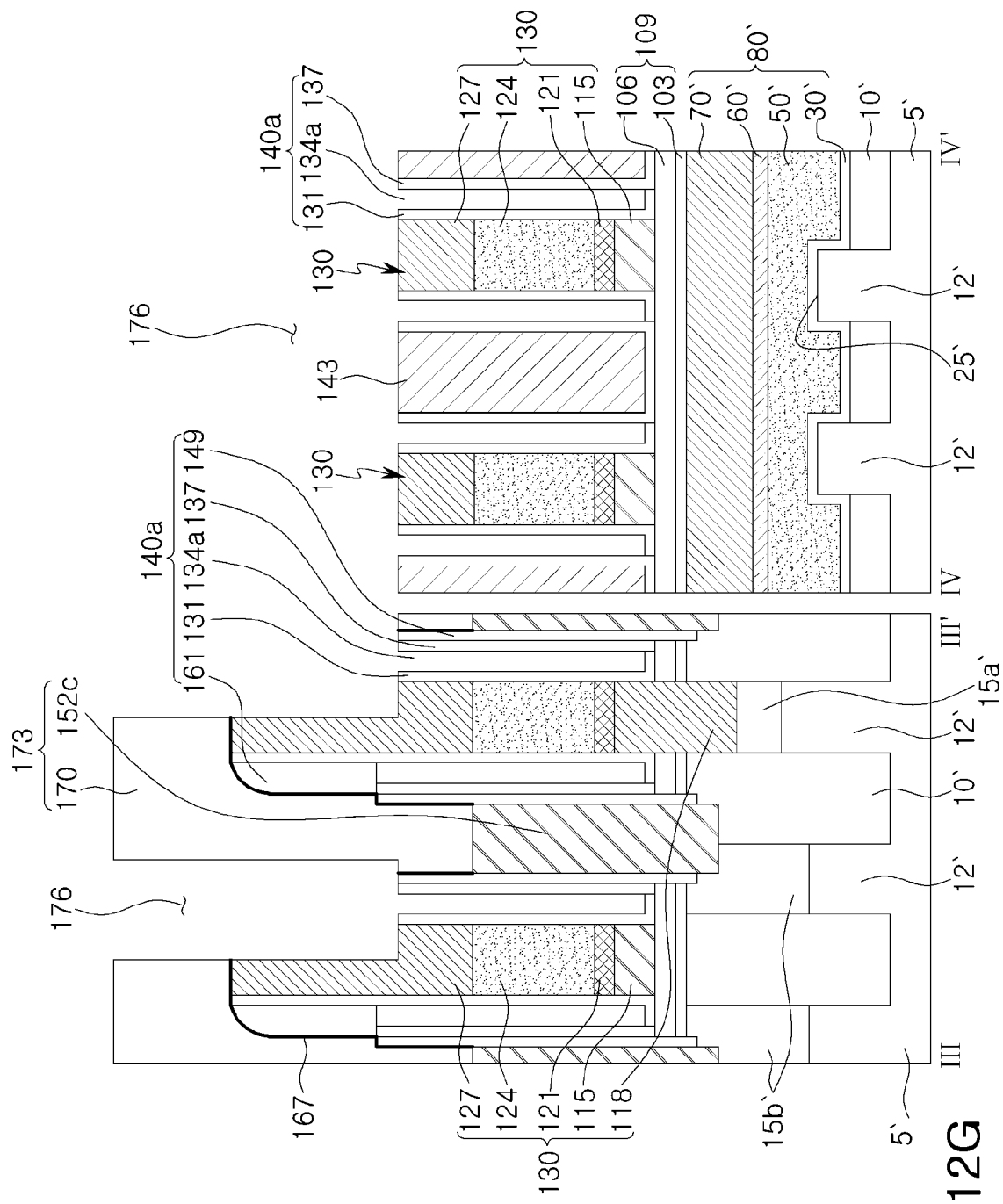

Referring to FIG. 8 and FIG. 12G, the sacrificial capping layer 164 may be removed. Subsequently, by forming, on the lower contact patterns 152c, an upper conductive layer covering the wiring structures 130, and by patterning the upper conductive layer to form openings 176, upper contact patterns 170 may be formed. The sacrificial spacer (indicated as 134 in FIG. 12F) of the preliminary spacer (indicated as 140" in FIG. 12F) may be exposed as portions of the preliminary spacer (indicated as 140" in FIG. 12F) and the wiring capping insulating patterns 127 are being etched. Subsequently, the exposed sacrificial spacer (indicated as 134 in FIG. 12F) may be removed to form an air gap 134a. Accordingly, the preliminary spacer (indicated as 140" in FIG. 12F) may be formed into a spacer 140a including the air gap 134a.

Again, referring to FIG. 8 and FIG. 9, the upper insulating pattern 179 may be formed to fill the opening (indicated as 176 in FIG. 12G) and seal an upper portion of the air gap 134a.

According to example embodiments, a method of forming a semiconductor device may include forming a structure having an opening, forming a conductive layer to cover the structure, etching the conductive layer to form a preliminary conductive pattern remaining within the opening, measuring an etching depth of the preliminary conductive pattern within the opening, and performing a thickness control process to thin the preliminary conductive pattern to form a conductive pattern.

In a case in which the conductive pattern is a gate electrode, the opening may be the gate trench 25 described with reference to FIG. 11A, the structure having an opening may be the active region 12 and the field region 10 described with reference to FIG. 11A, the preliminary conductive pattern may be the preliminary conductive pattern 45 described with reference to FIG. 11B, and the thickness control process may be the thickness control process 55 described with reference to FIG. 11C.

Similarly, the lower contact pattern 152c described above may be formed to have a reference thickness by using a method similar to the one used for forming the gate electrode. For example, in a case in which the conductive pattern is the lower contact pattern 152c, the opening may be the contact hole 146 described with reference to FIG. 12B; the structure having an opening may include the wiring structures 130, the preliminary spacers 140', and the insulating fences 143, described with reference to FIG. 12B; the preliminary conductive pattern may be a preliminary conductive pattern 152 described with reference to FIG. 12B, and/or a preliminary conductive pattern 152b described with reference to FIG. 12E; and the thickness control process may be a process of forming the sacrificial capping layer 155 described with reference to FIG. 12C, and/or a process of forming the sacrificial capping layer 164 described with reference to FIG. 12F. Accordingly, in the case in which the conductive pattern is the lower contact pattern 152c, the upper contact pattern 170 described above may be formed on the lower contact pattern 152c.

Even when the etching depth (indicated as D1 in FIG. 11B) formed through an etching process of etching the conductive layer varies for each wafer forming a semiconductor device, by using the thickness control process 55 described above, the final upper gate electrode 45a may be formed to have a reference thickness, thus improving wafer variation characteristics.

According to various example embodiments, by using a thickness control process using an oxidation and/or nitriding process, preliminary conductive patterns thinned through an etching process may be further thinned to form conductive patterns having reference thicknesses. Such conductive patterns having reference thicknesses may be used for gate electrodes or contact structures. Accordingly, semiconductor devices may be continuously produced with gate electrodes having uniform thicknesses and/or contact structures having uniform thicknesses, and thus, variations in thickness characteristics among the semiconductor devices may be improved.

While example embodiments have been shown and described above, it will be apparent to those skilled in the art that modifications and variations may be made without departing from the scope of the present inventive concept as defined by the appended claims. Therefore, the example embodiments described above should be understood only as examples without limiting the present disclosure.

What is claimed is:

1. A semiconductor device comprising:
   a substrate including an active region;
   a gate trench disposed in the substrate and crossing the active region;
   a gate dielectric layer disposed in the gate trench;
   a first gate electrode disposed on the gate dielectric layer and including titanium nitride, the first gate electrode including a center portion and an edge portion that is adjacent to the center portion;
   a second gate electrode disposed on the first gate electrode and including a doped polysilicon material;
   a gate capping insulating layer disposed on the second gate electrode and filling the gate trench; and
   a first impurity region and a second impurity region disposed in the substrate, the first impurity region being disposed opposite to the second impurity region with respect to the gate trench,
   wherein a top surface of each of the center portion and the edge portion of the first gate electrode contacts a bottom surface of the second gate electrode,
   a top surface of the second gate electrode is concave,
   a bottom surface of the gate capping insulating layer is convex, and
   a side surface of the gate capping insulating layer contacts the gate dielectric layer.

2. The semiconductor device of claim 1, wherein the bottom surface of the second gate electrode is disposed lower than a bottom surface of the first impurity region and is disposed higher than a bottom surface of the second impurity region.

3. The semiconductor device of claim 1, wherein the gate capping insulating layer includes a first gate capping insulating layer disposed on the second gate electrode and a second gate capping insulating layer that is disposed on the first gate capping insulating layer,
   the first gate capping insulating layer of the gate capping insulating layer includes silicon oxide, silicon nitride, or silicon oxynitride, and
   the second gate capping insulating layer of the gate capping insulating layer includes silicon nitride.

4. The semiconductor device of claim 3, wherein a thickness of the first gate capping insulating layer of the gate capping insulating layer is less than a thickness of the second gate capping insulating layer of the gate capping insulating layer.

5. The semiconductor device of claim 3, wherein the first gate capping insulating layer of the gate capping insulating layer includes a center portion and an edge portion that is disposed adjacent to the center portion, and
   a thickness of the center portion of the first gate capping insulating layer of the gate capping insulating layer is less than a thickness of the edge portion of the first gate capping insulating layer of the gate capping insulating layer.

6. The semiconductor device of claim 3, wherein a top surface of the first gate capping insulating layer of the gate capping insulating layer is concave, and a bottom surface of the first gate capping insulating layer of the gate capping insulating layer is convex.

7. The semiconductor device of claim 3, wherein a bottom surface of the second gate capping insulating layer of the gate capping insulating layer is convex, and a top surface of the second gate capping insulating layer of the gate capping insulating layer is substantially coplanar with a top surface of the substrate.

8. The semiconductor device of claim 1, further comprising an insulating layer that is disposed between the gate capping insulating layer and the gate dielectric layer,
   wherein the insulating layer includes silicon oxynitride.

9. The semiconductor device of claim 1, wherein the gate dielectric layer includes a first portion that is disposed on a bottom surface and a side surface of the first gate electrode, and a second portion that is disposed on a side surface of the second gate electrode and the side surface of the gate capping insulating layer, and
   the second portion of the gate dielectric layer includes nitrogen.

10. The semiconductor device of claim 1, wherein the bottom surface of the second gate electrode is more flat than the top surface of the second gate electrode.

11. A semiconductor device comprising:
    a substrate including an active region;
    a gate trench disposed in the substrate and crossing the active region;
    a gate dielectric layer disposed in the gate trench;
    a first gate electrode disposed on the gate dielectric layer and including titanium nitride, the first gate electrode including a center portion and an edge portion that is adjacent to the center portion;
    a second gate electrode disposed on the first gate electrode and including a doped polysilicon material;
    a gate capping insulating layer disposed on the second gate electrode; and a first impurity region and a second impurity region disposed in the substrate, the first impurity region being disposed opposite to the second impurity region with respect to the gate trench, wherein a top surface of each of the center portion and the edge portion of the first gate electrode contacts a bottom surface of the second gate electrode, a top surface of the second gate electrode is concave, a bottom surface of the gate capping insulating layer is convex, a side surface of the gate capping insulating layer contacts the gate dielectric layer, and the bottom surface of the second gate electrode is disposed lower than a bottom surface of the first impurity region and is disposed higher than a bottom surface of the second impurity region.

12. A semiconductor device comprising:
a substrate including an active region;
a gate trench disposed in the substrate and crossing the active region;
a gate dielectric layer disposed in the gate trench;
a first gate electrode disposed on the gate dielectric layer and including titanium nitride, the first gate electrode including a center portion and an edge portion that is adjacent to the center portion;
a second gate electrode disposed on the first gate electrode and including a doped polysilicon material;
a first gate capping insulating layer disposed on the second gate electrode and including silicon oxide, silicon nitride, or silicon oxynitride; and
a second gate capping insulating layer disposed on the first gate capping insulating layer and filling the gate trench,
wherein a top surface of each of the center portion and the edge portion of the first gate electrode contacts a bottom surface of the second gate electrode,
a top surface of the second gate electrode is concave, and
a side surface of the first gate capping insulating layer contacts the gate dielectric layer.

13. The semiconductor device of claim 12, wherein the second gate capping insulating layer includes silicon nitride.

14. The semiconductor device of claim 12, wherein at least one of a bottom surface of the first gate capping insulating layer and a bottom surface of the second gate capping insulating layer are convex.

15. The semiconductor device of claim 12, wherein a thickness of the first gate capping insulating layer is less than a thickness of the second gate capping insulating layer.

16. The semiconductor device of claim 12, wherein the bottom surface of the second gate electrode is more flat than the top surface of the second gate electrode.

17. The semiconductor device of claim 12, wherein a top surface of the second gate capping insulating layer is substantially coplanar with a top surface of the substrate.

18. The semiconductor device of claim 12, wherein the first gate capping insulating layer includes a center portion and an edge portion that is disposed adjacent to the center portion, and a thickness of the center portion of the first gate capping insulating layer is less than a thickness of the edge portion of the first gate capping insulating layer.

19. The semiconductor device of claim 12, wherein the gate dielectric layer includes a first portion that is disposed on a bottom surface and a side surface of the first gate electrode, and a second portion that is disposed on a side surface of the second gate electrode, the side surface of the first gate capping insulating layer and a side surface of the second gate capping insulating layer, and the second portion of the gate dielectric layer includes nitrogen.

20. A semiconductor device comprising:
a substrate including an active region;
a gate trench disposed in the substrate and crossing the active region;
a gate dielectric layer disposed in the gate trench;
a first gate electrode disposed on the gate dielectric layer;
a second gate electrode disposed on an inner side surface and an inner bottom surface of the first gate electrode;
a third gate electrode disposed on a top surface of the first gate electrode and a top surface of the second gate electrode, the third gate electrode including a doped polysilicon material;
a first gate capping insulating layer disposed on the second gate electrode and including silicon oxide, silicon nitride, or silicon oxynitride; and
a second gate capping insulating layer disposed on the first gate capping insulating layer and filling the gate trench, the second gate capping insulating layer including silicon nitride,
wherein a top surface of the third gate electrode is concave, and
a side surface of the first gate capping insulating layer contacts the gate dielectric layer.

* * * * *